United States Patent
Obata et al.

(10) Patent No.: US 7,951,442 B2
(45) Date of Patent: May 31, 2011

(54) THIN FILM FOR REFLECTION FILM OR FOR SEMI-TRANSPARENT REFLECTION FILM, SPUTTERING TARGET AND OPTICAL RECORDING MEDIUM

(75) Inventors: Tomokazu Obata, Isehara (JP); Hiroshi Yanagihara, Isehara (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 784 days.

(21) Appl. No.: 11/915,434

(22) PCT Filed: Nov. 17, 2006

(86) PCT No.: PCT/JP2006/322933
§ 371 (c)(1),
(2), (4) Date: Nov. 26, 2007

(87) PCT Pub. No.: WO2008/059582
PCT Pub. Date: May 22, 2008

(65) Prior Publication Data
US 2010/0215892 A1  Aug. 26, 2010

(51) Int. Cl.
*B32B 3/02* (2006.01)
(52) U.S. Cl. .................... 428/64.1; 428/64.4; 430/270.1
(58) Field of Classification Search .................. None
See application file for complete search history.

(56) References Cited

U.S. PATENT DOCUMENTS

| | | | |
|---|---|---|---|
| 6,177,166 B1 * | 1/2001 | Ohno et al. | 428/64.1 |
| 2003/0180177 A1 * | 9/2003 | Murata | 420/503 |
| 2004/0005432 A1 | 1/2004 | Ridout et al. | 428/64.4 |
| 2006/0104853 A1 * | 5/2006 | Tauchi et al. | 420/501 |

FOREIGN PATENT DOCUMENTS

| | | |
|---|---|---|
| JP | 59-38781 A | 3/1984 |
| JP | 06-243509 | 9/1994 |
| JP | 11-134715 | 5/1999 |
| JP | 2000-109943 | 4/2000 |
| JP | 2003-06926 | 1/2003 |
| JP | 2004-043868 * | 2/2004 |
| JP | 2004-43868 A | 2/2004 |
| JP | 2004-197117 | 7/2004 |
| JP | 2005-50497 | 2/2005 |
| JP | 2005-293646 | 10/2005 |
| JP | 2006-127594 | 5/2006 |

* cited by examiner

*Primary Examiner* — Elizabeth Mulvaney
(74) *Attorney, Agent, or Firm* — Roberts & Roberts, LLP

(57) ABSTRACT

A thin film for a reflection film or for a semi-transparent reflection film, having a compound phase formed of at least one chemical compound selected from the group consisting of a nitride, an oxide, a composite oxide, a nitroxide, a carbide, a sulfide, a chloride, a silicide (excluding silicon), a fluoride, a boride, a hydride, a phosphide, a selenide and a telluride of aluminum, magnesium, tin, zinc, indium, titanium, zirconium, manganese and silicon, dispersed in a matrix formed of silver or a silver alloy. The thin film may disperse at least one compound selected from the group consisting of a nitride, an oxide, a composite oxide, a nitroxide, a carbide, a sulfide, a chloride, a silicide, a fluoride, a boride, a hydride, a phosphide, a selenide and a telluride of silver, gallium, palladium or copper, in addition to aluminum or the like, therein. The thin film of the present invention keeps its reflectance without significant loss even after a long period of use, and can prolong the life of various devices which comprise the thin film as a reflection film, such as an optical recording medium and a display. The thin film can be also applied to semi-reflective/semi-transparent film used in the optical recording medium.

21 Claims, 2 Drawing Sheets

(a)

Material structure (b)

THIN FILM FOR REFLECTION FILM OR FOR SEMI-TRANSPARENT REFLECTION FILM, SPUTTERING TARGET AND OPTICAL RECORDING MEDIUM

TECHNICAL FIELD

The present invention relates to a thin film useful as a reflection film or a semi-transparent reflection film used in an optical recording medium, a display and the like. The present invention particularly relates to the thin film which shows reflectance that does not decrease even after it is used for a long period of time, and the optical recording medium having the thin film as the reflection film or the semi-transparent reflection film.

BACKGROUND ART

An optical recording medium, such as a CD-R/RW, a DVD-R/RW/RAM and a Blue-Ray disk, and a display device, such as a liquid crystal display and an organic luminescent display have at least one layer of a reflection film formed therein. For instance, FIG. 1 shows a structure of an HD-DVD (one-sided, dual-layer rewritable disk) which has been developed in recent years, as an example of the optical recording medium. As shown in the example, the optical recording medium has a multilayer structure comprising the reflection film in addition to a recording layer which plays a predominant role of the function of the optical recording medium, a protective layer and a thermal diffusion layer.

Many conventional reflection films are made from silver. This is because silver has a high reflectance and is less expensive than gold having a high reflectance similarly to silver. Silver also has excellent optical transparency when the film thickness is appropriately adjusted, accordingly can be possibly used as a semi-transparent reflection film, and from this fact, has been applied to an optical recording medium being developed now (cf. FIG. 1).

On the other hand, silver has a problem of changing the color to black through being corroded to decrease its reflectance, because of being inferior in corrosion resistance. The factor of causing corrosion in a reflection film is, for instance, an organic dye applied in a recording layer of an optical recording medium, though it depends on an applied medium and device. Then, the reflection film shows lower reflectance since it is corroded by the organic dye after a long term of service. In addition, the reflection film in a display device may cause corrosion due to the atmospheric moisture. For this reason, a thin film made from a silver alloy has been developed which contains various elements in a silver matrix, so as to solve the problem of the corrosion resistance of silver.

For instance, Patent Document 1 discloses a silver alloy containing 0.5 to 10 atom % ruthenium and 0.1 to 10 atom % aluminum, and Patent Document 2 discloses a silver alloy containing 0.5 to 4.9 atom % palladium. In addition, Patent Document 3 and Patent Document 4 disclose a silver alloy containing Ca, V and Nb, and the like.

Patent Document 1: Japanese Patent Laid-Open No. 11-134715
Patent Document 2: Japanese Patent Laid-Open No. 2000-109943
Patent Document 3: Japanese Patent Laid-Open No. 6-243509
Patent Document 4: Japanese Patent Laid-Open No. 2003-6926

DISCLOSURE OF THE INVENTION

Problems to be Solved by the Invention

A thin film composed of the above described silver alloy shows a certain improvement effect on corrosion resistance. Then, the problem of corrosion should have been solved, but an optical recording medium using a thin film formed from the silver alloy still can not completely inhibit a recording error caused by the degradation of the reflection film. On the other hand, a material more excellent in reflectance-keeping characteristics than ever has been required along with requirement to a further improvement of a recording speed and recording density toward future.

On the basis of the background, the present invention is directed at providing a thin film that is applied to a reflection film and to a semi-transparent reflection film, which compose an optical recording medium, a display and the like, and that can function without decreasing its reflectance even after a long period of use; and a production method therefore.

Means for Solving the Problems

In order to solve such a problem, the present inventors have made an extensive research on a mechanism how a silver thin film degrades its reflection characteristics, and found that the degradation is caused not only by simple corrosion (blackening) but also by a phenomenon that silver atoms migrate while the thin film is heated. The phenomenon of migration of silver atoms is a phenomenon that silver atoms composing a flat thin film right after it is formed migrate toward an energetically stable state through being driven by a given environmental condition. At this time, the silver atoms migrate not only in a planar direction but also in a three-dimensional direction in many cases, and as a result, cohere into a polygonal shape close to a sphere. When such a three-dimensionally cohered body is formed in the thin film, a laser beam incident on the thin film is reflected toward irregular directions with respect to an incident axis and consequently toward many directions. Accordingly, an optical recording medium employing such a thin film for a reflection film reflects less light toward a sensor of an optical recording device in a sensor axis direction, and consequently causes an error in the recording medium.

The above described phenomenon of the migration and cohesion of silver atoms differs from a corrosion phenomenon. In this regard, it is considered that a conventional silver alloy has a little effect of inhibiting a migration phenomenon of silver atoms. This is because a metal atom alloyed with silver should have some function of inhibiting the migration of silver atoms. However, it is assumed that the conventional silver alloy mainly has aimed at improving corrosion resistance, and accordingly all the alloyed components have not been effective for inhibiting the migration of the silver atoms.

Then, the present inventors studied a technique for inhibiting silver atoms from migrating in a thin film; examined silver alloys having the effect; found that it is effective as a further improved remedy for inhibiting the silver atoms from migrating to disperse a silver compound phase in silver or a silver alloy, and thus formed thin film acquires superior reflectance-keeping characteristics; and attained the present invention.

Specifically, the present invention provides a thin film for a reflection film or a semi-transparent reflection film, which has a phase of at least one compound selected from the group consisting of a nitride, an oxide, a composite oxide, a nitroxide, a carbide, a sulfide, a chloride, a silicide (excluding silicon), a fluoride, a boride, a hydride, a phosphide, a selenide and a telluride of aluminum, magnesium, tin, zinc, indium, titanium, zirconium, manganese and silicon, dispersed in a matrix formed of silver or a silver alloy.

In the present invention, it becomes possible to inhibit the migration of silver atoms composing a matrix formed of silver or a silver alloy and maintain the flatness of a thin film, by dispersing the phase formed of any of the above described nine compounds in the matrix, and thereby to inhibit the reflectance from deteriorating even when the thin film has undergone heat.

Specific examples of the compound phase are shown in Table 1. These compounds include compounds in a stoichiometrically nonequilibrium state, in addition to compounds having a composition in a stoichiometrically equilibrium state as shown in Table 1, which makes the compounds stably exist; and accordingly, f.e. AlN (aluminum nitride) includes $Al_xN_{1-x}$ (0<x<1).

TABLE 1

|  | Al | Mg | Sn | Zn | In | Ti | Zr | Mn | Si |
|---|---|---|---|---|---|---|---|---|---|
| Nitride | AlN | $Mg_3N_2$ | $Sn_5N_4$ | $Zn_3N_2$ | InN | TiN | ZrN | $Mn_3N_2$ | $Si_3N_4$ |
|  | $(Al_{1-x}N_x)$ | $(Mg_{0.66-a}N_a)$ | $(Sn_{1.23-f}N_f)$ | $(Zn_{0.66-a}N_a)$ | $(In_{1-x}N_x)$ | $(Ti_{1-x}N_x)$ | $(Zr_{1-x}N_x)$ | $(Mn_{1.66-e}N_e)$ | $(Si_{1.33-f}N_f)$ |
| Oxide | $Al_2O_3$ | MgO | $SnO_2$ | ZnO | $In_2O_3$ | $TiO_2$ | $ZrO_2$ | MnO | $SiO_2$ |
|  | $(Al_{1.5-a}O_a)$ | $(Mg_{1-x}O_x)$ | $(Sn_{2-y}O_y)$ | $(Zn_{1-x}O_x)$ | $(In_{1.5-a}O_a)$ | $(Ti_{2-y}O_y)$ | $(Zr_{2-y}O_y)$ | $(Mn_{1-x}O_x)$ | $(Si_{2-y}O_y)$ |
| Carbide | $Al_4C_3$ | $Mg_3C$ | $Sn_3C$ | ZnC | $In_4C_3$ | TiC | ZrC | $Mn_3C$ | SiC |
|  | $(Al_{0.75-b}C_b)$ | $(Mg_{0.33-d}C_d)$ | $(Sn_{1-x}C_x)$ | $(Zn_{0.33-d}C_d)$ | $(In_{0.75-b}C_b)$ | $(Ti_{1-x}C_x)$ | $(Zr_{1-x}C_x)$ | $(Mn_{0.33-d}C_d)$ | $(Si_{1-x}C_x)$ |
| Sulfide | $Al_2S_3$ | MgS | SnS | ZnS | $In_2S_3$ | $TiS_2$ | $ZrS_2$ | MnS | SiS |
|  | $(Al_{1.5-a}S_a)$ | $(Mg_{1-x}S_x)$ | $(Sn_{1-x}S_x)$ | $(Zn_{1-x}S_x)$ | $(In_{1.5-a}S_a)$ | $(Ti_{2-y}S_y)$ | $(Zr_{2-y}S_y)$ | $(Mn_{1-x}S_x)$ | $(Si_{1-x}S_x)$ |
| Fluoride | $AlF_3$ | $MgF_2$ | $SnF_2$ | $ZnF_2$ | $InF_3$ | $TiF_2$ | $ZrF_2$ | $MnF_2$ | $SiF_2$ |
|  | $(Al_{3-y}F_y)$ | $(Mg_{2-y}F_y)$ | $(Sn_{1-x}F_y)$ | $(Zn_{2-y}F_y)$ | $(In_{3-y}F_y)$ | $(Ti_{2-y}F_y)$ | $(Zr_{2-y}F_y)$ | $(Mn_{2-y}F_y)$ | $(Si_{2-y}F_y)$ |
| Boride | $AlB_2$ | $MgB_2$ | $SnB_2$ | ZnB | $InB_2$ | $TiB_2$ | $ZrB_2$ | MnB | $SiB_6$ |
|  | $(Al_{2-y}B_y)$ | $(Mg_{2-y}B_y)$ | $(Sn_{2-y}B_y)$ | $(Zn_{1-x}B_x)$ | $(In_{2-y}B_y)$ | $(Ti_{2-y}B_y)$ | $(Zr_{2-y}B_y)$ | $(Mn_{1-x}B_x)$ | $(Si_{6-w}B_w)$ |
| Silicide | AlSi | $Mg_2Si$ | $SnSi_2$ | ZnSi | InSi | $TiSi_2$ | $ZrSi_2$ | MnSi | — |
|  | $(Al_{1-x}Si_x)$ | $(Mg_{0.5-e}O_e)$ | $(Sn_{2-y}Si_y)$ | $(Zn_{1-x}S_x)$ | $(In_{1-x}S_x)$ | $(Ti_{2-y}Si_y)$ | $(Zr_{2-y}Si_y)$ | $(Mn_{1-x}Si_x)$ |  |
| Chloride | $AlCl_3$ | $MgCl_2$ | $SnCl_2$ | $ZnCl_2$ | $InCl_3$ | $TiCl4$ | $ZrCl_4$ | $MnCl_2$ | $SiCl_4$ |
|  | $(Al_{3-y}Cl_y)$ | $(Mg_{2-y}Cl_y)$ | $(Sn_{2-y}Cl_y)$ | $(Zn_{2-y}Cl_y)$ | $(In_{3-y}Cl_y)$ | $(Ti_{4-vCl}Cl_v)$ | $(Zr_{4-v}Cl_v)$ | $(Mn_{2-y}Cl_y)$ | $(Si_{4-vCl}Cl_v)$ |
| Phosphide | AlP | $Mg_3P_2$ | SnP | $Zn_3P_2$ | InP | TiP | ZrP | $Mn_2P$ | SiP |
|  | $(Al_{1-x}P_x)$ | $(Mg_{0.55-c}P_c)$ | $(Sn_{1-x}P_x)$ | $(Zn_{0.55-c}P_c)$ | $(In_{1-x}P_x)$ | $(Ti_{1-x}P_x)$ | $(Zr_{1-x}P_x)$ | $(Mn_{0.5-a}P_a)$ | $(Si_{1-x}P_x)$ |
| Selenide | $Al_2Se_3$ | MgSe | SnSe | ZnSe | $In_2Se_3$ | $TiSe_2$ | $ZrSe_2$ | MnSe | $SiSe_2$ |
|  | $(Al_{1.5-a}Se_a)$ | $(Mg_{1-x}Se_x)$ | $(Sn_{1-x}Se_x)$ | $(Zn_{1-x}Se_x)$ | $(In_{1.5-a}Se_a)$ | $(Ti_{2-y}Se_y)$ | $(Zr_{2-y}Se_y)$ | $(Mn_{1-x}Se_x)$ | $(Si_{2-y}Se_y)$ |
| Telluride | $Al_2Te_3$ | MgTe | SnTe | ZnTe | $In_2Te_3$ | $TiTe_2$ | $ZrTe_2$ | MnTe | $SiTe_2$ |
|  | $(Al_{1.5-a}Te_a)$ | $(Mg_{1-x}Te_x)$ | $(Sn_{1-x}Te_x)$ | $(Zn_{1-x}Te_x)$ | $(In_{1.5-a}Te_a)$ | $(Ti_{2-y}Te_y)$ | $(Zr_{1-y}Te_y)$ | $(Mn_{1-x}Te_x)$ | $(Si_{2-y}Te_y)$ |
| Complex oxide | $AlTiO_5$ | $MgIn_2O_4$ | $SnSb_2O_5$ | $ZnAl_2O_4$ | $InFeO_3$ | $TiMgO_3$ | $ZrSiO_4$ | $MnFe_2O_4$ | $SiGeO_4$ |

$0 < x < 1, 0 < y < 2, 0 < z < 3, 0 < v < 4, 0 < w < 6$
$0 < a < 1.5, 0 < b < 0.75, 0 < c < 0.66, 0 < d < 0.33, 0 < e < 0.5, 0 < f < 1.33$

In addition, the thin film according to the present invention may include any of silver compounds among nitride, an oxide, a composite oxide, a nitroxide, carbide, sulfide, chloride, silicide, fluoride, boride, hydride, phosphide, selenide and telluride of silver, as a compound phase. Specific examples of the silver compound are shown in Table 2. The silver compounds include not only intentionally formed compounds but also the compounds which are concurrently produced when the above described compound phase of aluminum or the like is formed, as is described later in an item on a method for producing the thin film. The compound phase formed of the silver compound also acts to inhibit silver atoms in the thin film from migrating, similarly as the compound phase of aluminum or the like does. In addition, this silver compound phase includes a compound in a stoichiometrically non-equilibrium state as well.

TABLE 2

| Nitride | AgN ($Ag_{1-x}N_x$) |
|---|---|
| Oxide | $Ag_2O$, AgO ($Ag_{1-x}O_x$) |
| Carbide | AgC ($Ag_{1-x}C_x$) |

TABLE 2-continued

| Sulfide | $Ag_2S$ ($Ag_{2-x}S_x$) |
|---|---|
| Fluoride | AgF ($Ag_{1-x}F_x$) |
| Boride | AgB ($Ag_{1-x}B_x$) |
| Silicide | AgSi ($Ag_{1-x}Si_x$) |
| Chloride | AgCl ($Ag_{1-x}Cl_x$) |
| Phosphide | AgP ($Ag_{1-x}P_x$) |
| Selenide | $Ag_2Se$ ($Ag_{2-y}Se_y$) |
| Telluride | $Ag_2Te$ ($Ag_{2-y}Te_y$) |
| Composite | $Ag_2MO_4$ $Ag_2WO_4$ |
| oxide | $AgVO_3$ $Ag_2CrO_4$ |
|  | $Ag_4P_2O_7$ $Ag_3PO_4$ |

$0 < x < 1, 0 < y < 2$

Furthermore, the thin film according to the present invention may include a chemical compound of a particular metal other than the above described metal (aluminum and the like, silver), as a compound phase. Specifically, the thin film may contain, in a dispersed state, at least one compound selected from the group consisting of a nitride, an oxide, a composite oxide, a nitroxide, a carbide, a sulfide, a chloride, a silicide, a fluoride, a boride, a hydride, a phosphide, a selenide and a telluride of gallium, palladium or copper. Specific examples of the compound phase of such a particular metal are shown in Table 3. These metallic compounds include compounds in a stoichiometrically non-equilibrium state as well.

TABLE 3

|  | Ga | Cu | Pd |
|---|---|---|---|
| Nitride | GaN ($Ga_{1-x}N_x$) | $Cu_3N$ ($Cu_{3-z}N_z$) | PdN ($Pd_{1-x}N_x$) |
| Oxide | $Ga_2O_3$ ($Ga_{1.5-a}O_a$) | $Cu_2O$ ($Cu_{2-y}O_y$) | PdO ($Pd_{1-x}O_x$) |
| Carbide | GaC ($Ga_{1-x}C_x$) | CuC ($Cu_{1-x}C_x$) | PdC ($Pd_{1-x}C_x$) |
| Sulfide | GaS ($Ga_{1-x}S_x$) | CuS ($Cu_{1-x}S_x$) | PdS ($Pd_{1-x}S_x$) |
| Fluoride | GaF ($Ga_{1-x}F_x$) | $CuF_2$ ($Cu_yO_{2-y}$) | PdF ($Pd_{1-x}F_x$) |
| Boride | GaB ($Ga_{1-x}B_x$) | CuB ($Cu_{1-x}B_x$) | PdB ($Pd_{1-x}B_x$) |
| Silicide | GaSi ($Ga_{1-x}Si_x$) | $Cu_5Si$ ($Cu_{5-b}O_b$) | PdSi ($Pd_{1-x}Si_x$) |
| Chloride | $GaCl_3$ ($Ga_xCl_{3-x}$) | CuCl ($Cu_{1-x}Cl_x$) | $PdCl_2$ ($Pd_yB_{2-y}$) |
| Phosphide | GaP ($Ga_{1-x}P_x$) | CuP ($Cu_{1-x}P_x$) | PdP ($Pd_{1-x}P_x$) |
| Selenide | GaSe ($Ga_{1-x}Se_x$) | CuSe ($Cu_{1-x}Se_x$) | PdSe ($Pd_{1-x}Se_x$) |
| Telluride | GaTe ($Ga_{1-x}Te_x$) | CuTe ($Cu_{1-x}Te_x$) | PdTe ($Pd_{1-x}Te_x$) |

TABLE 3-continued

| | Ga | Cu | Pd |
|---|---|---|---|
| Composite oxide | CuGaS$_2$, AgGaS$_2$<br>CuGaSe$_2$, AgGaSe$_2$<br>CuGaTe$_2$, AgGaTe$_2$ | CuFe$_2$O$_4$, CuMoO$_4$<br>CuTiO$_3$, CuCr$_2$O$_4$<br>CuWO$_4$, CuSeO$_4$ | |

$0 < x < 1, 0 < y < 2, 0 < z < 3, 0 < a < 1.5, 0 < b < 5$

The content of the above described compound phase is preferably 0.001 to 2.5 wt. %. The compound phase in an amount of 0.001 wt. % or more is necessary for sufficiently inhibiting the migration of silver atoms. In addition, the upper limit is set at 2.5 wt. % because the silver compound contained above the upper limit imparts an insufficient initial reflectance to the thin film. Accordingly, the content of the compound phase is preferably 0.001 to 1.0 wt. %, and further preferably is 0.001 to 0.5 wt. %. As the content of the compound phase increases, the effect of inhibiting reflectance reduction increases but the reflectance tends to decrease. It is preferable to control the content of the compound phase according to an application field within the above described range. In the above description, the content of the compound phase is based on the total weight of the thin film (the total weight of the matrix and the compound phase). In addition, when the compound phase includes a compound of silver and a compound of a particular metal, the content of the compound phase shall be the total content of those compounds.

In addition, the compound phases are preferably dispersed in a particulate form composed of many molecules of the compound, but are not always limited to this form. Specifically, the compound phase may be formed of molecules of at least one chemical compound. The size of the compound phase is preferably controlled into ¹/₁₀ or less of a thickness of a thin film. For instance, when the thickness of the thin film is set at 1,000 Å, the compound phase preferably has a size of 100 Å or smaller, and when the thickness of the thin film is set at 120 Å, the dispersing compound phase preferably has a size of 12 Å or smaller.

On the other hand, the matrix of the thin film according to the present invention is pure silver or silver alloy. In the present invention, the effect of inhibiting the migration of silver atoms is mainly made by a compound phase, but alloyed components also possess an effect to be reckoned with. On the other hand, even though pure silver is employed as the matrix, the thin film acquires excellent reflectance-keeping characteristics due to the action of the compound phase. For this reason, in the present invention, any of pure silver and a silver alloy shall be used as the matrix.

When a silver alloy is employed as the matrix, the alloy is preferably an alloy formed from silver and at least any one element of aluminum, magnesium, tin, zinc, indium, titanium, zirconium, manganese and silicon. These elements are metallic elements composing the compound phase shown at the beginning of the above description, but also form alloy components by being alloyed with silver to inhibit the migration phenomenon of silver atoms.

In addition, a silver alloy as the matrix may include a metal other than aluminum. Specifically, a silver alloy as the matrix may employ at least one element among gallium, palladium, and copper, as an alloying element. This is because these metallic elements are those which compose the compound phase shown in the third group of the above description, and also shows not a little effect of inhibiting the migration phenomenon of silver atoms by being alloyed with silver.

When the above described silver alloy is employed as the matrix, the concentration of a metal to be alloyed with silver is preferably 0.01 to 10 wt. %. This is because when the concentration is less than 0.01 wt. %, the alloying effect is negligible, and when the concentration exceeds 10 wt. %, the thin film aggravates its reflectance. Furthermore, the concentration is more preferably 0.01 to 5 wt. %, and further preferably is 0.01 to 3.5 wt %. The above described concentration of the metal is based on a weight of the silver alloy of the matrix.

In the next place, the method for producing a thin film according to the present invention will be described. A reflection film according to the present invention has preferably a thickness of 120 to 1,200 Å when applied to an optical recording medium, a display and the like. When producing such a thin film, it is preferable to apply a sputtering technique as a production method. When applying the sputtering technique for producing the thin film containing a compound phase, the technique includes two directions which is described below.

A first technique is a method of using a target having a structure and a composition similar to a thin film to be produced, specifically, is a method of using a sputtering target prepared by dispersing a phase of at least one compound selected from the group consisting of a nitride, an oxide, a composite oxide, a nitroxide, a carbide, a sulfide, a chloride, a silicide (excluding silicon), a fluoride, a boride, a hydride, a phosphide, a selenide and a telluride of aluminum, magnesium, tin, zinc, indium, titanium, zirconium, manganese and silicon, in a matrix formed of silver or a silver alloy. The method can produce the thin film with the use of one plate of target, accordingly can produce the thin film by a sputtering technique with a form of arranging the target so as to face a substrate, which is ordinarily employed when producing a reflection film, and consequently produce the thin film with adequate productivity. Here, there are further three forms in the sputtering target for producing the thin film according to the present invention, as is described below.

A first form is an internally chemically-combined type target. The internally chemically-combined type target is prepared by heat-treating a raw material made from silver (pure silver) or a silver alloy in an atmosphere of high-pressure oxygen gas, nitrogen gas or the like to chemically combine a metal to be alloyed with silver or the silver alloy in the interior partially with oxygen or nitrogen or the like into the oxide, the nitride or the like. The raw material described in the above may have a tabular shape close to the shape of the target, or may be prepared by employing a granular material, chemically combining the interior with other elements for the raw material, and then compression-molding the resultant granular material.

A second form to be used is a sintered target. The sintered target is prepared by mixing a powder of silver (pure silver) or a silver alloy with a powder made from a compound to be dispersed in the target in accordance with a desired composition, compressing and molding the mixed powder, and sintering the compact. The sintered target is useful when the above described internally chemically-combined type target is difficult to produce such as in the case when the target can hardly contain a sufficient concentration of a compound phase, and is preferable for producing a thin film, for instance, in which aluminum oxide, manganese oxide, or magnesium nitride is dispersed as a compound phase.

A third form is an embedded type target. The embedded type target is prepared by embedding a small piece (with a cylindrical shape, a spherical shape or the like though the shape is not limited) of a chemical compound to be dispersed, into a region to be consumed by sputtering in a target made from pure silver or a silver alloy. The above described internally chemically-combined type target and sintered target have a composition and a structure microscopically close to those of a thin film to be produced, as is shown in FIG. 2(a), whereas this target has those macroscopically close to the thin film to be produced, as is shown in FIG. 2(b). When the target is used, the composition of the thin film to be produced can be controlled by changing a diameter of the small piece of the compound to be embedded, positions of the small pieces to be arranged, the number of the pieces and a sputtering rate.

In the above described three types of targets, a content of a compound phase is preferably controlled so as to have the same composition as a thin film to be produced. Accordingly, the content of the chemical compound is preferably 0.001 to 2.5 wt. %, more preferably is 0.001 to 1.0 wt. %, and further preferably is 0.001 to 0.5 wt. %. In addition, the size of the compound phase in these targets is not limited in particular, and may be the same molecular level as in the thin film to be produced, or may be a millimeter order as in the embedded type target. This is because whatever the sizes of the compound phase, a compound is sputtered in a molecule unit when being sputtered, and the formed thin film acquires the desired composition.

Because it is preferable that the target has the same composition as in an objective thin film to be produced, a silver alloy as the matrix is preferably an alloy which contains silver and at least any one element of aluminum, magnesium, tin, zinc, indium, titanium, zirconium, manganese and silicon, or further at least any one element of gallium, palladium and copper. The concentration of a metal element to be alloyed is preferably 0.01 to 10 wt. %, more preferably is 0.01 to 5 wt. %, and further preferably is 0.01 to 3.5 wt. %.

The second directionality for producing a thin film according to the present invention is to improve a sputtering method. The method employs mainly a general target of pure silver or a silver alloy as a target, and does not employ a special target as is used in the above described first directionality. In the second directionality, there are further two applicable techniques which are described below.

A first technique is a co-sputtering technique with the use of a plurality of targets. The technique is a method of simultaneously sputtering a plurality of targets made from a chemical compound and a metal having the same composition as in a phase composing a thin film. For instance, the thin film having a compound phase formed of titanium carbide (TiC) dispersed in silver or a silver alloy can be produced by using two targets of a pure silver target or a silver alloy target, and a titanium carbide target, placing them together in a chamber, and simultaneously sputtering the two targets. The method is useful when it is difficult to prepare a special target such as the above described internally chemically-combined type target.

In addition, it is particularly useful in the second direction to employ a reactive sputtering technique. The reactive sputtering is a technique of adding a reactive gas such as oxygen and nitrogen into an atmosphere for sputtering, sputtering the target, oxidizing or nitriding the whole or a part of a particle sputtered from a target, and forming a thin film from the oxidized or nitrided particle. The reactive sputtering technique is a useful method when a chemical compound to be dispersed in the thin film is expensive, is hardly available or is difficult to be chemically prepared.

The reactive sputtering technique may be singularly used, but may be used in combination with another technique. For instance, when using the above described special integral target, specifically, using an internally chemically-combined target, a sintered target and an embedded type target, and when it is anticipated that a content of a chemical compound in a thin film will be insufficient only by singly using the targets, it is possible to increase a content of a chemical compound in the thin film by introducing a reactive gas into an atmosphere in a sputtering apparatus. In addition, when producing a thin film by using a co-sputtering technique as well, it is possible to adjust the amount of the chemical compound by using the reactive sputtering technique in combination with the co-sputtering technique.

BEST MODE FOR CARRYING OUT THE INVENTION

Figure 1:
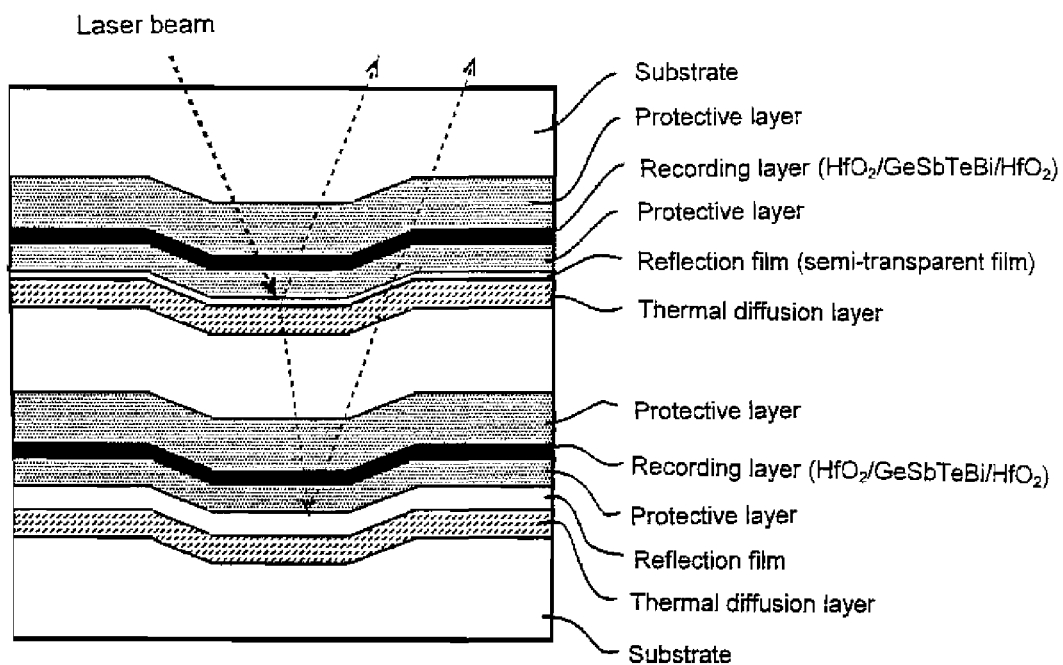
FIG. 1 illustrates an example of a structure for an HD-DVD.
Figure 2:
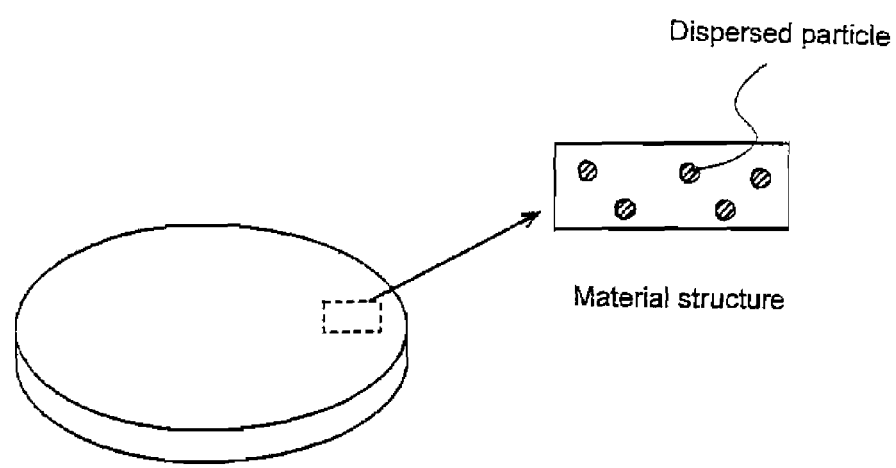
FIG. 2 illustrates specific examples of a sputtering target for producing a reflection film or a semi-transparent reflection film according to the present invention.
Figure 2:
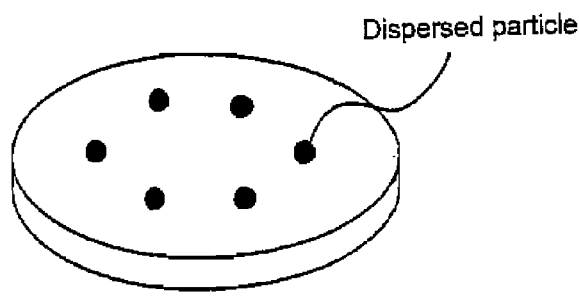

In the present embodiment, at first, three targets were produced which were an internally chemically-combined type target, a sintered type target and an embedded type target. Then, a thin film was produced not only by using these targets, but also by using a co-sputtering technique and a reactive sputtering technique. By the way, when compositions of a target and a thin film are expressed hereafter, they are expressed in the form of matrix/compound phase, and in the form, a front part of "/" represents a matrix and a rear part represents a compound phase. When a silver alloy is used as the matrix, the concentration of an alloying element is expressed by weight % with respect to the silver alloy of the matrix. For instance, Ag-3.0 wt. % Ga-2.0 wt. % Cu/1.0 wt. % $Si_3N_4$ of sample No. 21, means that the thin film (target) has 1.0 wt. % $Si_3N_4$ dispersed in the matrix of a silver alloy having a composition of Ag-3.0 wt. % Ga-2.0 wt. % Cu, with respect to a total weight of the thin film (target).

A: Production of Sputtering Target (a) Internally Chemically-combined Type Target An internally chemically-combined type target was prepared by the steps of: preparing 5.0 kg of a granular raw material of Ag-0.33 wt. % Al alloy with a particle diameter of 1.0 to 3.0 mm; charging it into a high-pressure reaction pot; sufficiently replacing the air inside the pot with nitrogen gas; increasing a pressure and a temperature respectively to 0.8 MPa of a nitrogen gas pressure and 800° C.; keeping the pot in the state for 48 hours for subjecting Al to internal nitriding; then, slowly cooling the internally nitrided alloy grains; taking them out; charging them into a die; high-pressure-extruding them at 750° C. into an integrated compact; forging the compact; rolling the forged compact into a plate (with dimension of 160 mm×160 mm×6 mm); and cutting the plate into a sputtering target having a standard size (with a diameter of 152 mm (6 inches) and a thickness of 5 mm). The target had a composition of Ag/0.5 wt. % AlN, which includes 0.5 wt. % aluminum nitride as the compound phase and silver as the matrix. The composition corresponds to a sample No. 1 which is described later.

In addition to the above described target, an Ag/2.5 wt. % ZnO (sample No. 3) target was prepared as an internally chemically-combined type target. The target of the sample No. 3 was produced by using an Ag-2.0 wt. % Zn alloy as a raw material, and oxidizing the interior with an oxygen gas pressure of 0.4 MPa and at 750° C. for a holding period of 10 hours. Furthermore, targets corresponding to samples No. 2, 4 to 8, and 6 to 9 were prepared by changing a silver alloy and an internally chemically-combining condition.

(b) Sintered Type Target

A sintered type target was produced by the steps of: preparing a powder of an Ag-5.0 wt. % Pd alloy and a powder of titanium nitride both with particle sizes of 50 to 100 μm; weighing the powders so as to form a desired composition; sufficiently mixing them; then charging the mixture into a die made from carbon; pressing the mixture to form a compact; then sintering the compact in a vacuum sintering furnace at 750° C. for 8 hours to form a sintered integral compact; forging and rolling the compact into a plate for further improving denseness; and then cutting the plate into a sputtering target with the same standard size as described previously. The target had a composition of Ag-5.0 wt. % Pd/2.0 wt % TiN. The target corresponds to the sample No. 18 which is described later.

In addition to the above target, targets corresponding to samples No. 9 to 20 were prepared as a sintered type target, by changing the types of a silver alloy powder and a compound powder.

(c) Embedded Type Target

An embedded type target was produced by the steps of: preparing a disc with a standard size (with a diameter of 152 mm (6 inches) and a thickness of 5 mm) made from an Ag-3.0 wt. % Ga-2.0 wt. % Cu alloy; perforating 6 round holes with a diameter of 1.05 mm at regular spaces so as to form a circle with a diameter of 80 mm; inserting round bars made from silicon oxide ($Si_3N_4$) with a diameter of 1.0 mm and a length of 5 mm into the round holes; and calking perimeters of the round bars so that the round bars might not drop off and could be fixed. The target had a composition of Ag-3.0 wt. % Ga-2.0 wt. % Cu/1.0 wt. % $Si_3N_4$. The target corresponds to the sample No. 21 which is described later.

In addition to the above targets, targets corresponding to samples No. 22, 23 were prepared as an embedded type target, by changing an alloy composition of a disc and a composition and the number of round bars to be embedded.

B: Production of Thin Film

A thin film was produced by using the above-described various targets, and by employing a co-sputtering technique and a reactive sputtering technique. Here, the thin film was formed on a polycarbonate substrate for DVD. The substrate (with a diameter of 120 mm and a sheet thickness of 0.6 mm) was produced through an injection molding machine provided with a stamper, in which a pre-format pattern was formed. On the top face of the substrate, a reflection film was formed into a film thickness of 120 Å with each method.

(i) A thin film was formed on a polycarbonate substrate by using each of three targets produced in the above described items (a) to (c); setting each target in a sputtering chamber; evacuating the chamber; introducing Ar gas till the pressure reaches $5.0 \times 10^{-1}$ Pa; placing a substrate right under the target in a resting state; and sputtering the target at a direct current of 0.4 kW for eight seconds. Then, the thickness of the resulting film was distributed within ±10%.

(ii) Co-Sputtering

After the two plates of a silver alloy target with a composition of Ag-0.8 wt. % Ga-1.0 wt. % Cu and a zinc oxide target mixed with 3 wt. % of aluminum oxide (commercial product) were set in a sputtering apparatus, and a substrate was mounted on the center of a turntable. Then, the inside of the apparatus was evacuated, and Ar gas was introduced therein until the pressure reached $5.0 \times 10^{-1}$ Pa. Subsequently, the thin film was formed on a substrate by the steps of rotating the substrate at 10 rpm; and applying sputtering electric powers of a direct current of 1.0 kW to the silver alloy target and a direct current of 0.1 kW to the zinc oxide target to sputter the targets for eight seconds. Thus produced thin film had a composition of Ag-0.8 wt. % Ga-1.0 wt. % Cu/0.97 wt. % ZnO-0.03 wt. % $Al_2O_3$. The composition corresponds to a sample No. 54 which is described later. By employing the co-sputtering technique, the composition of the thin film can be adjusted by changing the type of a silver alloy target and a target used in combination with the silver alloy target. In the present embodiment as well, the thin films of the samples No. 24 to 54 were produced by using the method.

(iii) Reactive Sputtering

After a silver alloy target with a composition of Ag-0.8 wt. % Ga-1.0 wt. % Cu-0.1 wt. % Ti was set in a sputtering apparatus, a substrate was mounted on the center of a turntable, the apparatus was evacuated, and Ar gas was introduced therein till the pressure reached $5.0 \times 10^{-1}$ Pa. Subsequently, nitrogen gas was introduced therein as a reactive gas. A partial pressure of the nitrogen gas was controlled into $2.0 \times 10^{-3}$ Pa. Subsequently, the thin film was formed on the substrate by the steps of: keeping the substrate rotating at 10 rpm; and applying a sputtering electric power of a direct current of 1.0 kW to the target to sputter the target for eight seconds. Thus produced thin film had a composition of Ag-0.8 wt. % Ga-1.0 wt. % Cu/0.1 wt. % TiN. The composition corresponds to a sample No. 184 which is described later. In the reactive sputtering technique, the composition of the thin film can be adjusted by selecting an appropriate type of the targets (the number of plates), controlling the partial pressure of the reactant gas, and increasing or decreasing each sputtering electric power to each target when two or more targets are used. In the present embodiment, the thin films of the samples No. 55 to 360 were produced by using the method.

C: Evaluation of Thin Film

A thin film was evaluated by evaluating characteristics of a DVD medium which was prepared by forming a thin film on a polycarbonate substrate in the above described way. The evaluation was conducted by the steps of: measuring a jitter value, a PI error, a PO failure and a reflectance of the DVD medium in an initial state after it was prepared, with the use of an optical disc evaluation instrument (optical disc evaluation instrument ODU-1000 made by Pulstec Industrial Co., Ltd.); and confirming whether they were within a range of DVD standards.

Subsequently subjecting the DVD medium to an accelerating environmental test of exposing the DVD medium to the environment of a temperature of 80° C. and a relative humidity of 85% for 500 hours; and measuring the respective values of the DVD medium after it was subjected to the accelerating environmental test by using the evaluation instrument. The results are shown in Table 4 to Table 12. The table also shows the result of a similar test on a DVD medium having a pure silver film formed thereon as a reflection film.

TABLE 4

| Sample No. | Sample composition wt. %[1] | Method for producing thin film[2] | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 1 | Ag/0.5AlN | a | 36.6 | 857.9 | 0.0 | 4.6 | 6.4 | 16.3 | 53.4 | 51.8 |
| 2 | Ag/0.5MgN | a | 48.9 | 1030.7 | 0.0 | 5.5 | 7.4 | 19.3 | 53.1 | 51.9 |
| 3 | Ag/2.5ZnO | a | 40.4 | 1026.5 | 0.0 | 5.4 | 6.8 | 19.3 | 52.3 | 52.2 |
| 4 | Ag/2.5In2O3 | a | 42.4 | 1144.3 | 0.0 | 5.8 | 7.2 | 19.3 | 52.2 | 51.4 |
| 5 | Ag/2.5SnO2 | a | 30.4 | 1013.4 | 0.0 | 5.7 | 7.3 | 19.3 | 51.8 | 51.3 |
| 6 | Ag/0.5TiN | a | 30.6 | 235.2 | 0.0 | 1.2 | 7.4 | 13.2 | 53.1 | 53.0 |
| 7 | Ag/0.5ZrN | a | 11.9 | 456.0 | 0.0 | 2.4 | 6.5 | 14.5 | 53.2 | 52.1 |
| 8 | Ag/0.5MnN | a | 19.2 | 635.5 | 0.0 | 3.1 | 6.8 | 16.0 | 53.1 | 52.2 |
| 9 | Ag—5.0Pd/1.5In2O3 | b | 38.5 | 1342.1 | 0.0 | 7.6 | 7.7 | 24.3 | 47.6 | 47.8 |
| 10 | Ag—10.0Ga/2.5In2O3 | b | 33.2 | 878.5 | 0.0 | 4.9 | 7.2 | 17.3 | 45.9 | 45.3 |
| 11 | Ag—5.0Ga/1.5SnO2 | b | 48.2 | 1171.1 | 0.0 | 5.9 | 6.7 | 20.3 | 49.8 | 49.2 |
| 12 | Ag—10.0Pd/2.5SnO2 | b | 22.9 | 1109.2 | 0.0 | 5.7 | 6.3 | 19.3 | 46.1 | 45.7 |
| 13 | Ag—5.0Pd/2.5MgN | b | 21.6 | 1149.4 | 0.0 | 6.4 | 7.4 | 22.3 | 47.3 | 47.3 |
| 14 | Ag—5.0Ga/2.5Al2O3 | b | 41.4 | 958.5 | 0.0 | 4.8 | 6.3 | 16.3 | 48.3 | 47.3 |
| 15 | Ag—10.0Ga/2.0AlN | b | 50.4 | 1183.2 | 0.0 | 6.7 | 7.4 | 22.3 | 45.9 | 45.4 |
| 16 | Ag—10.0Cu/2.5ZrN | b | 12.3 | 492.0 | 0.0 | 2.4 | 7.1 | 15.7 | 45.7 | 45.5 |
| 17 | Ag—5.0Cu/2.5MnO | b | 38.9 | 848.4 | 0.0 | 4.2 | 6.7 | 19.8 | 46.9 | 46.5 |
| 18 | Ag—5.0Pd/2.0TiN | b | 36.5 | 212.3 | 0.0 | 1.1 | 7.1 | 12.7 | 48.8 | 48.9 |
| 19 | Ag—10.0Sn/1.0TiN | b | 17.5 | 318.4 | 0.0 | 1.6 | 7.4 | 13.9 | 46.1 | 45.8 |
| 20 | Ag—10.0Cu/2.5TiN | b | 46.4 | 353.6 | 0.0 | 1.7 | 6.6 | 13.1 | 45.9 | 45.5 |
| 21 | Ag—3.0Ga—2.0Cu/1.0Si3N4 | c | 25.5 | 855.7 | 0.0 | 4.3 | 6.8 | 20.1 | 48.4 | 47.0 |
| 22 | Ag—2.0Pd—3.0Cu/1.0SiC | c | 23.6 | 970.6 | 0.0 | 4.6 | 6.2 | 18.5 | 48.0 | 48.0 |
| 23 | Ag—5.0Ga—5.0Cu/2.5SiO2 | c | 41.6 | 1066.0 | 0.0 | 5.2 | 7.5 | 23.1 | 46.3 | 45.4 |
|  | Ag100.0 |  | 23.8 | 1664.0 | 0.0 | 8.0 | 6.5 | 27.0 | 57.0 | 51.5 |

[1] A front part of "/" represents silver or a silver alloy of a matrix, and a rear part represents a compound phase.
[2] Methods for producing thin films are described below.
a: internally chemically-combined type target was used.
b: sintering type target was used.
c: embedded type target was used.
d: co-sputtering
e: reactive sputtering

TABLE 5

| Sample No. | Sample composition wt. %[1] | Method for producing thin film[2] | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 24 | Ag/0.5AlN—2.0GaN | d | 22.8 | 641.1 | 0.0 | 3.6 | 7.0 | 14.3 | 51.9 | 50.8 |
| 25 | Ag—10.0Cu/0.5AlN—1.5GaN | d | 41.3 | 228.0 | 0.0 | 1.3 | 6.7 | 7.3 | 45.8 | 45.3 |
| 26 | Ag—5.0Cu/0.5MgN—1.0GaN | d | 30.1 | 284.0 | 0.0 | 1.6 | 7.6 | 8.3 | 47.4 | 46.2 |
| 27 | Ag—2.0Ga/0.5ZnO—1.0Ga2O3 | d | 27.3 | 406.1 | 0.0 | 2.1 | 7.3 | 9.3 | 46.6 | 45.6 |
| 28 | Ag—5.0Cu/0.5ZnO—1.5Ga2O3 | d | 25.3 | 666.5 | 0.0 | 3.8 | 6.4 | 14.3 | 49.1 | 47.6 |
| 29 | Ag—10.0Pd/0.5MgO—1.5Ga2O3 | d | 17.8 | 855.4 | 0.0 | 4.7 | 6.3 | 17.3 | 46.6 | 45.9 |
| 30 | Ag—2.0Ga—2.0Zn/2.0AlN—0.5TiN | d | 25.8 | 1385.9 | 0.0 | 7.1 | 7.0 | 23.3 | 49.3 | 48.9 |
| 31 | Ag—2.0Ga—1.0Zn/2.5AlN | d | 27.6 | 874.1 | 0.0 | 4.9 | 7.5 | 16.3 | 49.7 | 49.9 |
| 32 | Ag—2.0Ga—1.0In—1.0Sn—2.5AlN | d | 16.3 | 598.1 | 0.0 | 3.5 | 7.6 | 13.3 | 47.5 | 47.6 |
| 33 | Ag—5.0Ga/2.0TiN | d | 49.5 | 282.1 | 0.0 | 1.3 | 6.2 | 12.1 | 49.3 | 49.5 |
| 34 | Ag—1.0Ti—2.0Cu/2.0TiN | d | 35.0 | 383.8 | 0.0 | 1.9 | 7.1 | 14.2 | 50.6 | 49.0 |
| 35 | Ag—1.0Ti—1.0Mn—2.0Cu—2.0TiC | d | 43.8 | 353.6 | 0.0 | 1.7 | 6.8 | 13.6 | 49.4 | 48.3 |
| 36 | Ag—5.0Ga/2.02ZrN | d | 17.9 | 490.0 | 0.0 | 2.5 | 7.5 | 16.2 | 48.7 | 48.7 |
| 37 | Ag—2.0Ga—3.0Cu/2.5ZrN | d | 49.9 | 399.0 | 0.0 | 2.1 | 7.5 | 15.4 | 46.9 | 46.9 |
| 38 | Ag—5.0Ti/2.0ZrC | d | 39.7 | 553.5 | 0.0 | 2.7 | 6.5 | 16.1 | 47.0 | 45.4 |
| 39 | Ag—5.0Mn/2.5ZrO2 | d | 18.2 | 559.7 | 0.0 | 2.9 | 6.2 | 15.7 | 49.6 | 48.5 |
| 40 | Ag—2.0Ga—1.0Cu/2.5ZrO2 | d | 23.2 | 598.3 | 0.0 | 3.1 | 7.2 | 16.7 | 48.9 | 47.9 |
| 41 | Ag—2.0Pd—1.0Cu/0.5MnN—2.0Cu3N | d | 31.8 | 617.6 | 0.0 | 3.2 | 6.8 | 17.2 | 50.0 | 48.8 |
| 42 | Ag—2.0Ga—2.0Cu/2.5MnN | d | 40.8 | 675.2 | 0.0 | 3.2 | 6.3 | 16.3 | 50.1 | 49.5 |
| 43 | Ag—2.0Pd—3.0Cu/2.0MnC | d | 44.1 | 696.5 | 0.0 | 3.5 | 7.2 | 18.8 | 48.8 | 47.8 |
| 44 | Ag—2.0Ga—1.0In—1.0Cu/2.5TiN | d | 28.1 | 881.5 | 0.0 | 4.3 | 6.9 | 19.2 | 48.1 | 46.5 |
| 45 | Ag—2.0Ga—1.0Sn—1.0Cu/2.0TiO2 | d | 11.3 | 1128.4 | 0.0 | 5.2 | 7.2 | 20.7 | 48.7 | 48.6 |
| 46 | Ag—2.0Ga—1.0Cu—1.0Sn/2.5MgN | d | 40.8 | 861.0 | 0.0 | 4.7 | 7.1 | 17.3 | 48.3 | 48.5 |
| 47 | Ag—2.0Ga—1.0In—1.0Zn/2.5MgO | d | 28.0 | 1351.8 | 0.0 | 6.8 | 7.5 | 22.3 | 47.5 | 47.1 |
| 48 | Ag/1.9In2O3—0.1SnO2 | d | 28.2 | 834.2 | 0.0 | 4.3 | 7.6 | 16.3 | 51.9 | 50.3 |
| 49 | Ag—4.0Pd/1.8In2O3—0.1SnO2—0.1ZnO | d | 23.1 | 1090.0 | 0.0 | 6.1 | 6.5 | 20.3 | 49.0 | 47.9 |

TABLE 5-continued

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 50 | Ag—5.0Pd/1.8In2O3—0.1SnO2—0.1Ga2O3 | d | 33.1 | 1133.9 | 0.0 | 5.8 | 6.9 | 19.3 | 46.7 | 46.9 |
| 51 | Ag—2.0Ga—2.0Cu/1.9In2O3—0.1SnO2 | d | 31.5 | 732.9 | 0.0 | 4.2 | 6.8 | 15.3 | 47.9 | 47.6 |
| 52 | Ag—4.0Ga/1.9In2O3—0.1SnO2 | d | 20.4 | 736.1 | 0.0 | 4.3 | 7.6 | 15.3 | 49.0 | 47.5 |
| 53 | Ag—2.0Pd—2.0Cu/1.9In2O3—0.1SnO2 | d | 45.7 | 770.4 | 0.0 | 4.5 | 6.6 | 15.3 | 50.1 | 50.2 |
| 54 | Ag—0.8Ga—1.0Cu/0.97ZnO—0.03Al2O3 | d | 30.2 | 873.4 | 0.0 | 4.4 | 7.5 | 16.3 | 47.9 | 46.8 |
|  | Ag100.0 |  | 23.8 | 1664.0 | 0.0 | 8.0 | 6.5 | 27.0 | 57.0 | 51.5 |

*1 A front part of "/" represents silver or a silver alloy of a matrix, and a rear part represents a compound phase.
*2 Methods for producing thin films are described below.
a: internally chemically-combined type target was used.
b: sintering type target was used.
c: embedded type target was used.
d: cO-sputtering
e: reactive sputtering

TABLE 6

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 55 | Ag—2.0PdO/0.1TiO2 | e | 48.2 | 993.2 | 0.0 | 5.2 | 6.7 | 18.3 | 51.4 | 50.5 |
| 56 | Ag—1.5Pd/0.1TiO2—0.01PdO | e | 40.8 | 543.4 | 0.0 | 2.6 | 6.4 | 12.1 | 49.9 | 49.9 |
| 57 | Ag—3.0Ga/0.1TiO2—0.01Ga2O3 | e | 36.3 | 349.2 | 0.0 | 1.8 | 6.8 | 10.6 | 50.4 | 49.3 |
| 58 | Ag—5.0Cu/0.1TiO2—2.0CuO | e | 37.0 | 893.2 | 0.0 | 4.4 | 7.2 | 16.9 | 49.2 | 48.9 |
| 59 | Ag—4.0Ti/0.1TiO2—2.0PdO | e | 38.1 | 610.7 | 0.0 | 3.1 | 6.9 | 13.4 | 47.6 | 47.7 |
| 60 | Ag—4.0Mg/0.1MgO—1.0PdO | e | 50.0 | 977.6 | 0.0 | 5.2 | 7.0 | 18.8 | 49.7 | 49.9 |
| 61 | Ag—4.0Al/0.1Al2O3—0.1PdO | e | 19.8 | 1194.8 | 0.0 | 5.8 | 7.5 | 20.9 | 49.6 | 48.3 |
| 62 | Ag—5.0Sn/0.1SnO2—0.1CuO | e | 15.1 | 968.2 | 0.0 | 4.7 | 7.1 | 17.1 | 48.9 | 48.2 |
| 63 | Ag—4.0In/0.1In2O3—0.1Ga2O3 | e | 25.8 | 720.0 | 0.0 | 3.6 | 7.0 | 15.2 | 50.3 | 50.5 |
| 64 | Ag—1.9Al—3.0Pd/0.1AlN | e | 43.9 | 438.9 | 0.0 | 2.1 | 6.6 | 11.6 | 49.5 | 49.5 |
| 65 | Ag—1.9Cu—3.0Pd/0.1AlN—0.1Cu3N | e | 14.4 | 333.0 | 0.0 | 1.8 | 7.6 | 11.3 | 48.4 | 48.6 |
| 66 | Ag—0.9Al—3.0Pd/0.1AlN—0.1Cu3N | e | 32.7 | 522.5 | 0.0 | 2.5 | 7.2 | 12.6 | 50.6 | 49.3 |
| 67 | Ag—1.0Cu—3.0Pd/0.1AlN—0.1AgN | e | 48.5 | 508.5 | 0.0 | 2.4 | 6.5 | 12.1 | 50.4 | 49.7 |
| 68 | Ag—3.0Cu—1.9Ga/0.1AlN—0.1GaN | e | 26.6 | 334.9 | 0.0 | 1.7 | 7.2 | 10.6 | 49.5 | 48.5 |
| 69 | Ag—0.9Al—4.0Pd/0.1AlN | e | 51.0 | 334.9 | 0.0 | 1.7 | 6.7 | 10.1 | 49.4 | 48.6 |
| 70 | Ag—1.0Cu—4.0Pd/0.1AlN—0.01AgN | e | 21.2 | 309.0 | 0.0 | 1.5 | 6.5 | 9.5 | 49.1 | 48.4 |
| 71 | Ag—0.4Al—4.0Pd/0.1AlN—0.01AgN | e | 29.4 | 123.6 | 0.0 | 0.6 | 6.9 | 8.2 | 50.7 | 49.6 |
| 72 | Ag—0.5Cu—4.0Pd/0.1AlN—0.01Cu3N | e | 35.1 | 473.8 | 0.0 | 2.3 | 7.2 | 12.8 | 49.3 | 49.1 |
| 73 | Ag—4.0Cu—1.0Ga/0.1AlN—0.01GaN | e | 11.6 | 222.0 | 0.0 | 1.2 | 6.7 | 9.1 | 50.6 | 48.5 |
| 74 | Ag—4.0Cu—0.5Ga/0.1AlN—0.01AgN | e | 29.5 | 236.4 | 0.0 | 1.2 | 7.6 | 10.5 | 48.9 | 48.0 |
| 75 | Ag—1.0Mg—4.0Pd/0.1Mg3N2—0.01AgN | e | 38.0 | 620.8 | 0.0 | 3.2 | 6.8 | 14.2 | 50.4 | 50.1 |
| 76 | Ag—1.0Cu—4.0Pd/0.1Mg3N2—0.01Cu3N | e | 26.0 | 310.4 | 0.0 | 1.6 | 7.1 | 10.7 | 47.7 | 46.8 |
| 77 | Ag—2.0Cu—3.0Pd/0.1Mg3N2—0.01AgN | e | 25.7 | 305.6 | 0.0 | 1.6 | 6.9 | 10.7 | 50.6 | 50.8 |
| 78 | Ag—1.0In—4.0Pd/0.1Mg3N2—0.01AgN | e | 28.9 | 588.7 | 0.0 | 2.9 | 6.2 | 12.0 | 48.5 | 47.5 |
| 79 | Ag—2.0In—2.5Pd/0.1Mg3N2—0.01AgN | e | 17.0 | 836.0 | 0.0 | 4.0 | 7.4 | 17.2 | 50.5 | 50.7 |
| 80 | Ag—1.0Sn—4.0Pd/0.1Mg3N2—0.01AgN | e | 33.4 | 968.2 | 0.0 | 4.7 | 6.9 | 18.3 | 48.2 | 47.9 |
| 81 | Ag—2.0Sn—2.5Pd/0.1Mg3N2—0.01AgN | e | 46.5 | 834.2 | 0.0 | 4.3 | 7.1 | 16.1 | 49.7 | 48.8 |
| 82 | Ag—1.0Mg—1.0Cu—3.0Ga/0.1Mg3N2—0.01GaN | e | 34.5 | 669.9 | 0.0 | 3.3 | 7.5 | 14.5 | 50.0 | 48.4 |
| 83 | Ag—1.0Cu—1.0Pd—3.0Ga/0.1Mg3N2—0.01GaN | e | 40.5 | 453.2 | 0.0 | 2.2 | 7.1 | 11.8 | 49.4 | 49.5 |
| 84 | Ag—1.0Mg—1.0Cu—2.0Pd/0.1Mg3N2—0.01Cu3N | e | 11.2 | 167.2 | 0.0 | 0.8 | 6.7 | 8.3 | 50.0 | 48.7 |
| 85 | Ag—1.0Cu—2.0Pd/0.1Mg3N2—0.01AgN | e | 24.6 | 223.3 | 0.0 | 1.1 | 7.3 | 9.7 | 49.9 | 48.6 |
| 86 | Ag—2.0Cu—2.0Pd/0.1Mg3N2—0.01Cu3N | e | 14.0 | 267.4 | 0.0 | 1.4 | 6.7 | 9.8 | 50.5 | 49.9 |
| 87 | Ag—1.0Sn/0.1SnO2—0.01Ag2O | e | 24.3 | 636.0 | 0.0 | 3.0 | 6.8 | 12.8 | 52.3 | 52.1 |
| 88 | Ag—1.0Sn—1.0Pd/0.1SnO2—0.01Ag2O | e | 25.8 | 492.5 | 0.0 | 2.5 | 7.3 | 12.3 | 51.3 | 49.9 |
| 89 | Ag—1.0In/0.1In2O3—0.01Ag2O | e | 44.9 | 388.5 | 0.0 | 2.1 | 7.1 | 11.4 | 52.2 | 50.8 |

TABLE 6-continued

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 90 | Ag—1.0In—1.0Sn/0.1In2O3—0.01Ag2O | e | 40.9 | 629.3 | 0.0 | 3.1 | 6.4 | 13.4 | 51.6 | 51.1 |
|  | Ag100.0 |  | 23.8 | 1664.0 | 0.0 | 8.0 | 6.5 | 27.0 | 57.0 | 51.5 |

*1 A front part of "/" represents silver or a silver alloy of a matrix, and a rear part represents a compound phase.
*2 Methods for producing thin films are described below.
a: internally chemically-combined type target was used.
b: sintering type target was used.
c: embedded type target was used.
d: co-sputtering
e: reactive sputtering

TABLE 7

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 91 | Ag—1.0Cu—0.8Ga—0.2TiN—0.01GaN | e | 47.0 | 540.0 | 0.0 | 2.7 | 7.1 | 13.2 | 50.3 | 48.8 |
| 92 | Ag—1.0Cu—0.8Ga/0.1ZrN—0.01Cu3N | e | 32.3 | 545.2 | 0.0 | 2.9 | 7.6 | 13.6 | 51.0 | 51.2 |
| 93 | Ag—1.0Cu—0.8Ga/0.1Si3N4—0.01GaN | e | 42.3 | 586.4 | 0.0 | 3.4 | 6.8 | 13.4 | 51.2 | 51.1 |
| 94 | Ag—1.0Cu—0.8Ga/0.1Mg3N2—0.01Cu3N | e | 22.4 | 800.0 | 0.0 | 4.0 | 7.0 | 16.5 | 50.4 | 49.7 |
| 95 | Ag—1.0Cu—0.8Ga/0.1AlN—0.01GaN | e | 15.4 | 611.2 | 0.0 | 3.2 | 6.9 | 14.5 | 52.0 | 51.6 |
| 96 | Ag—1.0Cu—0.8Ga/0.1Al2O3—0.01Ga2O3 | e | 28.4 | 705.8 | 0.0 | 3.1 | 7.1 | 14.6 | 53.1 | 52.2 |
| 97 | Ag—1.0Cu—1.0Pd/0.1In2O3—0.01CuO | e | 38.5 | 935.9 | 0.0 | 4.9 | 7.3 | 17.1 | 52.0 | 52.1 |
| 98 | Ag—1.0Cu—1.0Pd/0.1SnO2—0.01PdO | e | 51.2 | 954.0 | 0.0 | 4.5 | 6.2 | 15.5 | 50.1 | 49.2 |
| 99 | Ag—1.0Cu—1.0Pd/0.1ZnO—0.01CuO | e | 25.0 | 814.8 | 0.0 | 4.2 | 6.8 | 15.6 | 49.8 | 48.7 |
| 100 | Ag—1.0Cu—1.0Pd/0.2MgO—0.01PdO | e | 38.8 | 730.8 | 0.0 | 3.6 | 6.8 | 14.6 | 50.2 | 48.5 |
| 101 | Ag—1.0Cu—1.0Pd/0.1TiO2—0.01PdO | e | 33.0 | 678.4 | 0.0 | 3.2 | 6.7 | 13.7 | 50.5 | 48.9 |
| 102 | Ag—1.0Cu—1.0Pd/0.1ZrO2—0.01CuO | e | 28.2 | 530.0 | 0.0 | 2.5 | 7.6 | 12.9 | 51.2 | 50.2 |
| 103 | Ag—1.0Cu—1.0Pd/0.1MnO—0.01CuO | e | 14.4 | 1044.1 | 0.0 | 5.3 | 7.2 | 19.5 | 51.6 | 50.1 |
| 104 | Ag—1.0Cu—1.0Pd/0.1SiO2—0.01PdO | e | 43.8 | 695.6 | 0.0 | 3.7 | 7.4 | 16.4 | 50.7 | 49.3 |
| 105 | Ag/1.0Al4C3 | e | 37.8 | 764.2 | 0.0 | 4.0 | 7.2 | 16.1 | 53.5 | 53.6 |
| 106 | Ag/1.0AlN | e | 48.3 | 882.3 | 0.0 | 4.6 | 6.8 | 18.1 | 50.7 | 49.3 |
| 107 | Ag—0.9Al/0.1AlN | e | 24.2 | 796.0 | 0.0 | 4.2 | 6.9 | 16.9 | 51.7 | 50.4 |
| 108 | Ag—1.0Ga/0.1AlN | e | 46.7 | 318.0 | 0.0 | 1.6 | 6.9 | 9.7 | 52.1 | 52.2 |
| 109 | Ag—1.0Sn—1.0Ga/0.5AlN | e | 22.2 | 684.0 | 0.0 | 3.7 | 6.5 | 15.5 | 51.7 | 50.5 |
| 110 | Ag—1.0Cu—0.8Ga/0.1AlN | e | 30.6 | 224.4 | 0.0 | 1.2 | 6.3 | 8.7 | 51.8 | 51.2 |
| 111 | Ag—1.0Ga—1.0Pd/0.5AlN | e | 46.3 | 656.2 | 0.0 | 3.3 | 7.6 | 14.4 | 51.6 | 50.2 |
| 112 | Ag—1.0Cu—1.0Pd/0.1AlN | e | 17.8 | 415.3 | 0.0 | 2.1 | 6.4 | 11.0 | 51.9 | 51.9 |
| 113 | Ag/1.0Al2O3 | e | 21.0 | 1095.5 | 0.0 | 5.6 | 6.8 | 20.6 | 53.1 | 52.3 |
| 114 | Ag—0.9Al/0.1Al2O3 | e | 32.6 | 968.3 | 0.0 | 5.2 | 6.5 | 19.3 | 52.3 | 51.8 |
| 115 | Ag—1.0Ga/0.1Al2O3 | e | 44.9 | 536.1 | 0.0 | 2.7 | 7.6 | 12.7 | 52.5 | 52.5 |
| 116 | Ag—1.0Sn—1.0Ga/0.5Al2O3 | e | 41.8 | 880.6 | 0.0 | 4.8 | 6.3 | 19.0 | 52.1 | 51.3 |
| 117 | Ag—1.0Cu—0.8Ga/0.1Al2O3 | e | 23.1 | 402.1 | 0.0 | 2.1 | 6.6 | 11.3 | 52.4 | 52.5 |
| 118 | Ag—1.0Ga—1.0Pd/0.5Al2O3 | e | 24.2 | 856.2 | 0.0 | 4.3 | 7.6 | 17.1 | 51.7 | 51.3 |
| 119 | Ag—1.0Cu—1.0Pd/0.1Al2O3 | e | 18.3 | 576.9 | 0.0 | 3.1 | 7.7 | 13.6 | 51.4 | 50.3 |
| 120 | Ag/1.0In2O3 | e | 39.8 | 1237.7 | 0.0 | 6.2 | 6.9 | 22.1 | 53.5 | 52.7 |
| 121 | Ag—0.9In/0.1In2O3 | e | 13.2 | 1030.5 | 0.0 | 5.7 | 7.6 | 21.1 | 52.6 | 52.0 |
| 122 | Ag—1.0Ga/0.1In2O3 | e | 12.5 | 568.0 | 0.0 | 3.1 | 7.2 | 14.0 | 52.0 | 52.2 |
| 123 | Ag—1.0Sn—1.0Ga/0.5In2O3 | e | 20.9 | 956.5 | 0.0 | 5.3 | 7.3 | 19.6 | 52.3 | 51.6 |
| 124 | Ag—1.0Cu—0.8Ga/0.1In2O3 | e | 44.9 | 536.5 | 0.0 | 2.7 | 6.4 | 13.0 | 51.8 | 50.1 |
| 125 | Ag—1.0Ga—1.0Pd/0.5In2O3 | e | 34.3 | 836.3 | 0.0 | 4.6 | 6.2 | 17.9 | 52.3 | 52.5 |
| 126 | Ag—1.0Cu—1.0Pd/0.1In2O3 | e | 38.6 | 722.6 | 0.0 | 3.8 | 7.3 | 15.6 | 52.2 | 51.3 |
| 127 | Ag/1.0SnO2 | e | 10.8 | 1043.2 | 0.0 | 5.5 | 6.9 | 20.4 | 53.6 | 52.6 |
| 128 | Ag—0.9Sn/0.1SnO2 | e | 42.8 | 983.5 | 0.0 | 5.0 | 7.3 | 19.7 | 53.0 | 53.0 |
| 129 | Ag—1.0Ga/0.1SnO2 | e | 22.5 | 464.5 | 0.0 | 2.5 | 6.6 | 12.1 | 52.1 | 52.1 |
| 130 | Ag—1.0Sn—1.0Ga/0.5SnO2 | e | 32.5 | 818.3 | 0.0 | 4.5 | 6.8 | 18.2 | 52.6 | 52.5 |
| 131 | Ag—1.0Cu—0.8Ga/0.1SnO2 | e | 18.1 | 388.3 | 0.0 | 2.0 | 7.6 | 10.9 | 51.8 | 51.9 |
| 132 | Ag—1.0Ga—1.0Pd/0.5SnO2 | e | 26.1 | 779.7 | 0.0 | 4.0 | 7.1 | 16.6 | 51.8 | 51.4 |
| 133 | Ag—1.0Cu—1.0Pd/0.1SnO2 | e | 45.1 | 548.5 | 0.0 | 3.0 | 6.8 | 13.9 | 51.6 | 51.7 |
| 134 | Ag—1.0ZnO | e | 12.1 | 1096.9 | 0.0 | 6.0 | 6.6 | 22.2 | 53.1 | 53.1 |
| 135 | Ag—0.9Zn/0.1ZnO | e | 25.6 | 1047.4 | 0.0 | 5.5 | 7.3 | 20.2 | 51.0 | 51.0 |
| 136 | Ag—1.0Ga/0.1ZnO | e | 15.7 | 553.0 | 0.0 | 3.0 | 7.1 | 13.4 | 52.4 | 51.4 |
| 137 | Ag—1.0Sn—1.0Ga/0.5ZnO | e | 14.0 | 911.1 | 0.0 | 5.0 | 6.4 | 19.0 | 51.7 | 51.7 |
| 138 | Ag—1.0Cu—0.8Ga/0.1ZnO | e | 43.9 | 398.5 | 0.0 | 2.0 | 7.0 | 10.8 | 52.3 | 51.7 |
| 139 | Ag—1.0Ga—1.0Pd/0.5ZnO | e | 48.3 | 846.5 | 0.0 | 4.5 | 7.0 | 17.5 | 52.6 | 51.5 |

TABLE 7-continued

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 140 | Ag—1.0Cu—1.0Pd/0.1ZnO | e | 16.3 | 651.3 | 0.0 | 3.5 | 6.4 | 15.3 | 51.9 | 52.0 |
|  | Ag100.0 |  | 23.8 | 1664.0 | 0.0 | 8.0 | 6.5 | 27.0 | 57.0 | 51.5 |

*1 A front part of "/" represents silver or a silver alloy of a matrix, and a rear part represents a compound phase.

*2 Methods for producing thin films are described below.

a: internally chemically-combined type target was used.

b: sintering type target was used.

c: embedded type target was used.

d: co-sputtering e: reactive sputtering

TABLE 8

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 141 | Ag/1.0Mg3N2 | e | 44.1 | 861.4 | 0.0 | 4.5 | 7.7 | 17.6 | 53.9 | 53.8 |
| 142 | Ag—0.9Mg/0.1Mg3N2 | e | 47.9 | 777.6 | 0.0 | 4.0 | 7.7 | 16.2 | 53.6 | 53.6 |
| 143 | Ag—1.0Ga/0.1Mg3N2 | e | 44.0 | 281.4 | 0.0 | 1.5 | 6.6 | 9.4 | 53.2 | 52.8 |
| 144 | Ag—1.0Sn—1.0Ga/0.5Mg3N2 | e | 24.0 | 669.8 | 0.0 | 3.5 | 7.7 | 15.0 | 52.4 | 52.6 |
| 145 | Ag—1.0Cu—0.8Ga/0.1Mg3N2 | e | 11.7 | 187.2 | 0.0 | 1.0 | 7.1 | 8.0 | 51.5 | 51.3 |
| 146 | Ag—1.0Ga—1.0Pd/0.5Mg3N2 | e | 28.5 | 573.8 | 0.0 | 3.0 | 6.7 | 13.7 | 52.4 | 52.1 |
| 147 | Ag—1.0Cu—1.0Pd/0.1Mg3N2 | e | 25.7 | 393.1 | 0.0 | 2.0 | 6.7 | 10.7 | 52.6 | 52.4 |
| 148 | Ag/1.0MgO | e | 14.8 | 1276.3 | 0.0 | 6.5 | 6.2 | 22.9 | 53.3 | 52.5 |
| 149 | Ag—0.9Mg/0.1MgO | e | 10.9 | 1158.4 | 0.0 | 6.0 | 6.4 | 22.5 | 53.6 | 52.6 |
| 150 | Ag—1.0Ga/0.1MgO | e | 11.3 | 635.6 | 0.0 | 3.5 | 7.4 | 15.3 | 51.9 | 50.7 |
| 151 | Ag—1.0Sn—1.0Ga/0.5MgO | e | 18.1 | 1084.7 | 0.0 | 5.5 | 6.6 | 20.8 | 51.8 | 51.9 |
| 152 | Ag—1.0Cu—0.8Ga/0.1MgO | e | 26.4 | 479.2 | 0.0 | 2.5 | 7.0 | 12.4 | 53.0 | 52.4 |
| 153 | Ag—1.0Ga—1.0Pd/0.5MgO | e | 13.8 | 941.0 | 0.0 | 5.0 | 7.4 | 17.6 | 52.5 | 52.6 |
| 154 | Ag—1.0Cu—1.0Pd/0.1MgO | e | 54.3 | 786.4 | 0.0 | 4.0 | 6.7 | 15.8 | 51.8 | 51.1 |
| 155 | Ag—1.0Cu—0.8Ga/0.1TiN—0.02GaN | e | 39.4 | 1069.3 | 0.0 | 5.7 | 6.9 | 19.2 | 51.3 | 50.9 |
| 156 | Ag—1.0Cu—0.8Ga/0.2ZrN—0.02Cu3N | e | 32.8 | 1006.7 | 0.0 | 5.1 | 6.2 | 18.1 | 49.8 | 49.3 |
| 157 | Ag—1.0Cu—0.8Ga/0.1MnN—0.02GaN | e | 38.2 | 913.3 | 0.0 | 4.9 | 7.5 | 18.2 | 51.1 | 51.3 |
| 158 | Ag—1.0Cu—0.8Ga/0.2Mg3N2—0.02GaN | e | 37.5 | 1127.4 | 0.0 | 5.7 | 6.2 | 19.1 | 51.9 | 51.4 |
| 159 | Ag—1.0Cu—0.8Ga/0.2AlN—0.02AgN | e | 47.5 | 1079.5 | 0.0 | 5.7 | 6.6 | 20.4 | 50.8 | 50.2 |
| 160 | Ag—0.8Ga—1.0In/0.1In2O3—0.02GaN | e | 38.0 | 717.6 | 0.0 | 3.9 | 7.4 | 14.9 | 50.7 | 50.3 |
| 161 | Ag—0.8Ga—1.0Sn/0.1SnO2—0.02GaN | e | 13.1 | 849.1 | 0.0 | 4.6 | 7.6 | 16.8 | 50.7 | 49.5 |
| 162 | Ag—0.8Ga—1.0Zn/0.1ZnO—0.02GaN | e | 15.5 | 832.6 | 0.0 | 4.6 | 7.6 | 16.9 | 51.9 | 51.3 |
| 163 | Ag—1.0Cu—0.8Ga/0.2TiO2—0.02CuO | e | 37.7 | 1468.5 | 0.0 | 7.5 | 6.5 | 25.1 | 50.6 | 50.6 |
| 164 | Ag—1.0Cu—0.8Ga/0.2ZrO2—0.02Ga2O3 | e | 22.6 | 1385.2 | 0.0 | 7.4 | 7.0 | 25.5 | 50.2 | 49.7 |
| 165 | Ag—1.0Cu—0.8Ga/0.1MnO—0.02CuO | e | 38.9 | 1329.1 | 0.0 | 7.1 | 6.6 | 23.6 | 51.1 | 50.0 |
| 166 | Ag—1.0Cu—0.8Ga/0.1MgO—0.02Ga2O3 | e | 25.9 | 1111.5 | 0.0 | 5.9 | 6.3 | 21.0 | 50.4 | 49.9 |
| 167 | Ag—1.0Cu—0.8Ga/0.05Al2O3—0.02CuO | e | 34.4 | 1180.6 | 0.0 | 6.3 | 6.2 | 20.6 | 52.0 | 51.2 |
| 168 | Ag—1.0Cu—0.8Ga/0.05In2O3—0.02Ga2O3 | e | 49.9 | 1495.3 | 0.0 | 7.7 | 6.9 | 24.3 | 51.1 | 51.1 |
| 169 | Ag—1.0Cu—0.8Ga/0.1SnO2—0.02CuO | e | 28.8 | 1411.9 | 0.0 | 7.4 | 6.2 | 23.5 | 51.9 | 52.1 |
| 170 | Ag—1.0Cu—0.8Ga/0.1ZnO—0.02Ag2O | e | 14.0 | 1334.9 | 0.0 | 7.4 | 6.2 | 24.8 | 50.8 | 50.8 |
| 171 | Ag—1.0Cu—0.8Ga/0.1MgN—0.1TIN—0.02Cu3N | e | 27.9 | 704.8 | 0.0 | 3.6 | 7.6 | 13.8 | 51.5 | 50.1 |
| 172 | Ag—1.0Cu—0.8Ga/0.1MgN—0.1ZrN—0.02GaN | e | 48.2 | 621.3 | 0.0 | 3.3 | 7.0 | 13.4 | 51.7 | 49.7 |
| 173 | Ag—1.0Cu—0.8Ga/0.1MgN—0.1MnN—0.02AgN | e | 27.7 | 914.4 | 0.0 | 4.6 | 7.4 | 16.2 | 49.1 | 47.7 |
| 174 | Ag—1.0Cu—0.8Ga/0.1MgN—0.1AlN—0.02GaN | e | 20.7 | 700.4 | 0.0 | 3.9 | 7.4 | 15.1 | 50.1 | 50.3 |
| 175 | Ag—1.0Cu—0.8Ga/0.1AlN—0.1TiN—0.02Cu3N | e | 12.5 | 743.6 | 0.0 | 4.0 | 7.7 | 15 0 | 50.0 | 49.0 |
| 176 | Ag—1.0Cu—1.0Ga—0.1In/0.1TiN—0.02Cu3N | e | 38.2 | 689.9 | 0.0 | 3.9 | 6.7 | 14.7 | 50.3 | 48.4 |
| 177 | Ag—1.0Cu—1.0Ga—0.1Sn/0.1TiN—0.02Cu3N | e | 16.5 | 794.6 | 0.0 | 4.2 | 7.4 | 16.2 | 49.8 | 49.0 |
| 178 | Ag—1.0Cu—1.0Ga—0.1Zn/0.1TiN—0.02GaN | e | 39.9 | 675.8 | 0.0 | 3.9 | 6.8 | 15.4 | 49.2 | 48.1 |
| 179 | Ag/0.97ZnO—0.03Al2O3 | e | 23.7 | 974.7 | 0.0 | 4.9 | 6.4 | 16.5 | 53.3 | 52.7 |

TABLE 8-continued

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 180 | Ag/1.94ZnO—0.06Al2O3 | e | 17.2 | 935.9 | 0.0 | 4.9 | 7.1 | 17.6 | 51.9 | 50.1 |
|  | Ag100.0 |  | 23.8 | 1664.0 | 0.0 | 8.0 | 6.5 | 27.0 | 57.0 | 51.5 |

*1 A front part of "/" represents silver or a silver alloy of a matrix, and a rear part represents a compound phase.
*2 Methods for producing thin films are described below.
a: internally chemically-combined type target was used.
b: sintering type target was used.
c: embedded type target was used.
d: co-sputtering
e: reactive sputtering

TABLE 9

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 181 | Ag/1.0TiN | e | 31.0 | 821.3 | 0.0 | 4.3 | 6.6 | 16.1 | 52.2 | 51.2 |
| 182 | Ag—0.9Ti/0.1TiN | e | 23.8 | 1038.0 | 0.0 | 6.0 | 7.2 | 20.8 | 53.2 | 53.4 |
| 183 | Ag—1.0Ga/0.1TiN | e | 16.3 | 425.0 | 0.0 | 2.5 | 7.5 | 12.7 | 52.8 | 52.0 |
| 184 | Ag—1.0Cu—0.8Ga/0.1TiN | e | 21.0 | 291.0 | 0.0 | 1.5 | 6.6 | 9.6 | 52.0 | 51.2 |
| 185 | Ag—1.0Pd/0.1TiN | e | 37.2 | 743.9 | 0.0 | 4.3 | 7.1 | 16.9 | 53.1 | 52.4 |
| 186 | Ag—1.0Cu—1.0Pd/0.1TiN | e | 27.7 | 668.5 | 0.0 | 3.5 | 6.8 | 14.3 | 52.2 | 52.3 |
| 187 | Ag/1.0ZrN | e | 23.2 | 1020.0 | 0.0 | 6.0 | 7.2 | 20.9 | 52.4 | 51.1 |
| 188 | Ag—0.9Zr/0.1ZrN | e | 19.8 | 1202.8 | 0.0 | 6.2 | 6.3 | 21.4 | 53.4 | 52.3 |
| 189 | Ag—1.0Ga/0.1ZrN | e | 34.0 | 582.4 | 0.0 | 3.2 | 7.0 | 13.8 | 53.1 | 53.0 |
| 190 | Ag—1.0Cu—0.8Ga/0.1ZrN | e | 50.9 | 415.2 | 0.0 | 2.4 | 6.1 | 11.3 | 52.6 | 52.5 |
| 191 | Ag—1.0Pd/0.1ZrN | e | 41.7 | 726.6 | 0.0 | 4.2 | 6.8 | 15.7 | 53.1 | 53.0 |
| 192 | Ag—1.0Cu—1.0Pd/0.1ZrN | e | 46.1 | 299.2 | 0.0 | 1.7 | 7.4 | 11.4 | 51.9 | 51.7 |
| 193 | Ag/1.0MnN | e | 24.7 | 1337.6 | 0.0 | 7.6 | 6.4 | 25.0 | 52.3 | 52.0 |
| 194 | Ag—0.9Mn/0.1MnN | e | 17.4 | 1241.0 | 0.0 | 7.3 | 6.6 | 23.1 | 53.2 | 51.3 |
| 195 | Ag—1.0Ga/0.1MnN | e | 25.9 | 1054.5 | 0.0 | 5.7 | 6.8 | 20.6 | 53.3 | 53.5 |
| 196 | Ag—1.0Cu—0.8Ga/0.1MnN | e | 46.8 | 776.0 | 0.0 | 4.0 | 6.3 | 15.5 | 52.4 | 52.1 |
| 197 | Ag—1.0Pd/0.1MnN | e | 48.3 | 1228.3 | 0.0 | 7.1 | 6.5 | 20.9 | 53.4 | 52.0 |
| 198 | Ag—1.0Cu—1.0Pd/0.1MnN | e | 19.1 | 921.2 | 0.0 | 4.9 | 6.7 | 17.6 | 52.2 | 51.2 |
| 199 | Ag/1.0Si3N4 | e | 16.4 | 1391.2 | 0.0 | 7.4 | 7.0 | 22.9 | 52.1 | 50.9 |
| 200 | Ag—0.9Si/0.1Si3N4 | e | 35.9 | 1295.0 | 0.0 | 7.0 | 6.6 | 23.6 | 53.5 | 52.6 |
| 201 | Ag—1.0Ga/0.1Si3N4 | e | 14.3 | 1088.0 | 0.0 | 6.4 | 6.1 | 20.6 | 53.3 | 51.8 |
| 202 | Ag—1.0Cu—0.8Ga/0.1Si3N4 | e | 26.8 | 1337.0 | 0.0 | 7.0 | 7.4 | 23.7 | 52.6 | 52.2 |
| 203 | Ag—1.0Pd/0.1Si3N4 | e | 39.4 | 1466.4 | 0.0 | 7.8 | 6.7 | 22.9 | 53.4 | 53.6 |
| 204 | Ag—1.0Cu—1.0Pd/0.1Si3N4 | e | 43.5 | 1020.0 | 0.0 | 5.7 | 7.0 | 18.6 | 51.6 | 50.3 |
| 205 | Ag/1.0TiC | e | 28.8 | 1295.0 | 0.0 | 7.0 | 7.0 | 21.8 | 51.5 | 50.1 |
| 206 | Ag—0.9Ti/0.1TiC | e | 25.0 | 1310.4 | 0.0 | 7.2 | 6.9 | 24.1 | 53.6 | 52.2 |
| 207 | Ag—1.0Ga/0.1TiC | e | 14.9 | 1109.2 | 0.0 | 5.9 | 6.3 | 19.1 | 53.0 | 52.2 |
| 208 | Ag—1.0Cu—0.8Ga/0.1TiC | e | 17.5 | 859.2 | 0.0 | 4.8 | 6.6 | 17.2 | 52.3 | 50.9 |
| 209 | Ag—1.0Pd/0.1TiC | e | 18.3 | 1413.4 | 0.0 | 7.4 | 7.3 | 24.3 | 53.2 | 53.4 |
| 210 | Ag—1.0Cu—1.0Pd/0.1TiC | e | 39.9 | 1020.0 | 0.0 | 6.0 | 7.2 | 19.3 | 51.7 | 51.8 |
| 211 | Ag/1.0ZrC | e | 26.0 | 1320.0 | 0.0 | 7.5 | 6.9 | 23.3 | 52.4 | 52.6 |
| 212 | Ag—0.9Zr/0.1Zrc | e | 33.9 | 1313.5 | 0.0 | 7.1 | 7.4 | 22.9 | 53.3 | 53.4 |
| 213 | Ag—1.0Ga/0.1ZrC | e | 29.6 | 800.8 | 0.0 | 4.4 | 6.1 | 16.3 | 53.3 | 51.8 |
| 214 | Ag—1.0Cu—0.8Ga/0.1ZrC | e | 40.6 | 850.0 | 0.0 | 5.0 | 7.3 | 19.6 | 51.9 | 50.4 |
| 215 | Ag—1.0Pd/0.1ZrC | e | 27.1 | 1202.8 | 0.0 | 6.2 | 7.5 | 20.6 | 53.4 | 52.7 |
| 216 | Ag—1.0Cu—1.0Pd/0.1ZrC | e | 27.4 | 965.3 | 0.0 | 4.9 | 6.3 | 17.0 | 52.0 | 50.5 |
| 217 | Ag/1.0SiC | e | 22.5 | 1435.6 | 0.0 | 7.4 | 7.5 | 25.3 | 52.3 | 51.9 |
| 218 | Ag—0.9Si/0.1SiC | e | 27.0 | 1432.5 | 0.0 | 7.5 | 7.4 | 23.1 | 53.4 | 53.6 |
| 219 | Ag—1.0Ga/0.1SiC | e | 22.1 | 1292.0 | 0.0 | 7.6 | 7.4 | 25.5 | 52.7 | 51.5 |
| 220 | Ag—1.0Cu—0.8Ga/0.1SiC | e | 43.8 | 1258.0 | 0.0 | 6.8 | 6.5 | 22.5 | 51.6 | 51.4 |
| 221 | Ag—1.0Pd/0.1SiC | e | 40.2 | 1284.8 | 0.0 | 7.3 | 6.2 | 22.1 | 53.2 | 53.2 |
| 222 | Ag—1.0Cu—1.0Pd/0.1SiC | e | 36.8 | 1410.0 | 0.0 | 7.5 | 6.9 | 23.3 | 52.1 | 51.3 |
| 223 | Ag/1.0MnC | e | 43.4 | 1396.8 | 0.0 | 7.2 | 6.2 | 22.8 | 51.4 | 51.6 |
| 224 | Ag—0.9Mn/0.1MnC | e | 39.7 | 1406.0 | 0.0 | 7.6 | 6.5 | 23.5 | 53.3 | 53.2 |
| 225 | Ag—1.0Ga/0.1MnC | e | 19.0 | 1332.1 | 0.0 | 7.7 | 6.3 | 24.6 | 52.8 | 51.7 |
| 226 | Ag—1.0Cu—0.8Ga/0.1MnC | e | 48.1 | 1267.2 | 0.0 | 7.2 | 6.3 | 23.1 | 52.6 | 52.7 |
| 227 | Ag—1.0Pd/0.1MnC | e | 17.5 | 1401.4 | 0.0 | 7.7 | 6.5 | 24.8 | 53.2 | 53.0 |
| 228 | Ag—1.0Cu—1.0Pd/0.1MnC | e | 45.4 | 1396.8 | 0.0 | 7.2 | 7.5 | 23.5 | 52.8 | 52.3 |
| 229 | Ag/1.0TiO2 | e | 16.5 | 966.6 | 0.0 | 5.4 | 6.1 | 18.6 | 51.5 | 51.7 |

TABLE 9-continued

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 230 | Ag—0.9Ti/0.1TiO2 | e | 12.9 | 1072.6 | 0.0 | 6.2 | 7.2 | 20.8 | 53.1 | 52.5 |
|  | Ag100.0 |  | 23.8 | 1664.0 | 0.0 | 8.0 | 6.5 | 27.0 | 57.0 | 51.5 |

*1 A front part of "/" represents silver or a silver alloy of a matrix, and a rear part represents a compound phase.
*2 Methods for producing thin films are described below.
a: internally chemically-combined type target was used.
b: sintering type target was used.
c: embedded type target was used.
d: co-sputtering
e: reactive sputtering

TABLE 10

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 231 | Ag—1.0Ga/0.1TiO2 | e | 24.3 | 618.8 | 0.0 | 3.4 | 7.3 | 15.3 | 52.7 | 52.4 |
| 232 | Ag—1.0Cu—0.8Ga/0.1TiO2 | e | 14.6 | 352.0 | 0.0 | 2.0 | 6.5 | 11.2 | 52.2 | 50.7 |
| 233 | Ag—1.0Pd/0.1TiO2 | e | 31.7 | 1047.6 | 0.0 | 5.4 | 6.3 | 18.0 | 53.5 | 53.3 |
| 234 | Ag—1.0Cu—1.0Pd/0.1TiO2 | e | 48.1 | 473.2 | 0.0 | 2.6 | 6.2 | 11.5 | 51.6 | 51.4 |
| 235 | Ag/1.0ZrO2 | e | 29.2 | 1052.8 | 0.0 | 5.6 | 6.4 | 18.7 | 51.7 | 51.0 |
| 236 | Ag—0.9Zr/0.1ZrO2 | e | 36.0 | 1299.8 | 0.0 | 6.7 | 6.6 | 22.1 | 53.3 | 52.4 |
| 237 | Ag—1.0Ga/0.1ZrO2 | e | 12.2 | 827.2 | 0.0 | 4.4 | 7.3 | 17.7 | 53.2 | 51.8 |
| 238 | Ag—1.0Cu—0.8Ga/0.1ZrO2 | e | 20.6 | 363.3 | 0.0 | 2.1 | 6.4 | 10.9 | 52.1 | 50.4 |
| 239 | Ag—1.0Pd/0.1ZrO2 | e | 44.4 | 1034.0 | 0.0 | 5.5 | 6.6 | 18.4 | 53.1 | 53.3 |
| 240 | Ag—1.0Cu—1.0Pd/0.1ZrO2 | e | 36.2 | 509.6 | 0.0 | 2.8 | 7.3 | 13.3 | 51.7 | 51.1 |
| 241 | Ag/1.0SiO2 | e | 47.7 | 1396.8 | 0.0 | 7.2 | 6.4 | 22.2 | 52.6 | 52.0 |
| 242 | Ag—0.9Si/0.1SiO3 | e | 49.3 | 1176.4 | 0.0 | 6.8 | 7.5 | 23.7 | 53.2 | 51.8 |
| 243 | Ag—1.0Ga/0.1SiO2 | e | 25.9 | 788.0 | 0.0 | 4.0 | 6.9 | 16.4 | 52.7 | 51.4 |
| 244 | Ag—1.0Cu—0.8Ga/0.1SiO2 | e | 42.2 | 527.0 | 0.0 | 3.1 | 6.5 | 13.2 | 52.6 | 51.8 |
| 245 | Ag—1.0Pd/0.1SiO2 | e | 17.8 | 1071.6 | 0.0 | 5.7 | 7.2 | 20.6 | 53.3 | 53.2 |
| 246 | Ag—1.0Cu—1.0Pd/0.1SiO2 | e | 49.1 | 496.0 | 0.0 | 2.6 | 7.5 | 13.2 | 52.6 | 51.7 |
| 247 | Ag/1.0MnO | e | 11.9 | 1258.0 | 0.0 | 7.4 | 6.6 | 22.6 | 52.6 | 52.2 |
| 248 | Ag—0.9Mn/0.1MnO | e | 31.5 | 1270.9 | 0.0 | 7.1 | 7.1 | 23.5 | 53.5 | 52.4 |
| 249 | Ag—1.0Ga/0.1MnO | e | 38.2 | 1332.0 | 0.0 | 7.2 | 6.1 | 21.5 | 52.8 | 51.2 |
| 250 | Ag—1.0Cu—0.8Ga/0.1MnO | e | 20.9 | 1241.0 | 0.0 | 7.3 | 7.5 | 22.4 | 52.6 | 51.4 |
| 251 | Ag—1.0Pd/0.1MnO | e | 11.7 | 1316.0 | 0.0 | 7.0 | 7.0 | 23.1 | 53.1 | 52.8 |
| 252 | Ag—1.0Cu—1.0Pd/0.1MnO | e | 20.3 | 1466.4 | 0.0 | 7.8 | 7.2 | 25.1 | 52.0 | 50.9 |
| 253 | Ag/0.1AlN—2.0AgN | e | 39.1 | 123.6 | 0.0 | 0.6 | 7.2 | 8.4 | 53.6 | 52.8 |
| 254 | Ag/0.1AlN—0.1AgN | e | 11.6 | 190.8 | 0.0 | 0.9 | 7.0 | 8.8 | 55.2 | 55.4 |
| 255 | Ag—1.0Ga/0.1AlN—0.03AgN | e | 46.2 | 197.0 | 0.0 | 1.0 | 6.6 | 8.6 | 54.1 | 53.8 |
| 256 | Ag—1.0Cu—0.8Ga/0.1AlN—0.03AgN | e | 29.1 | 296.8 | 0.0 | 1.4 | 6.2 | 9.2 | 52.8 | 52.0 |
| 257 | Ag—1.0Pd/0.1AlN—0.03AgN | e | 37.0 | 174.6 | 0.0 | 0.9 | 6.3 | 6.2 | 54.3 | 53.4 |
| 258 | Ag—1.0Cu—1.0Pd/0.1AlN—0.03Cu3N | e | 23.3 | 282.0 | 0.0 | 1.5 | 6.4 | 10.1 | 53.4 | 52.8 |
| 259 | Ag—1.0Ga/0.1Mg3N2—0.03AgN | e | 21.6 | 329.6 | 0.0 | 1.6 | 7.4 | 11.0 | 54.9 | 53.4 |
| 260 | Ag—1.0Cu—0.8Ga/0.1Mg3N2—0.03GaN | e | 40.4 | 263.2 | 0.0 | 1.4 | 7.0 | 9.9 | 53.2 | 52.7 |
| 261 | Ag—1.0Pd/0.1Mg3N2—0.03AgN | e | 18.5 | 160.0 | 0.0 | 0.8 | 7.6 | 9.2 | 54.1 | 53.6 |
| 262 | Ag—1.0Cu—1.0Pd/0.1Mg3N2—0.03AgN | e | 44.3 | 222.0 | 0.0 | 1.2 | 7.4 | 10.2 | 52.6 | 51.6 |
| 263 | Ag—1.0Ga/0.1TiN—0.03AgN | e | 16.9 | 185.4 | 0.0 | 0.9 | 7.1 | 9.0 | 52.9 | 53.0 |
| 264 | Ag—1.0Cu—0.8Ga/0.1TiN—0.03Cu3N | e | 48.9 | 150.4 | 0.0 | 0.8 | 7.6 | 9.2 | 54.8 | 54.9 |
| 265 | Ag—1.0Pd/0.1TiN—0.03AgN | e | 48.1 | 400.0 | 0.0 | 2.0 | 7.3 | 11.6 | 53.9 | 53.6 |
| 266 | Ag—1.0Cu—1.0Pd/0.1TiN—0.03AgN | e | 11.7 | 125.4 | 0.0 | 0.6 | 6.2 | 7.5 | 54.1 | 52.6 |
| 267 | Ag—1.0Ga/0.1Si3N4—0.03AgN | e | 29.1 | 95.5 | 0.0 | 0.5 | 7.4 | 8.5 | 53.0 | 52.2 |
| 268 | Ag—1.0Cu—0.8Ga/0.1Si3N4—0.03AgN | e | 13.6 | 100.0 | 0.0 | 0.5 | 7.0 | 8.1 | 53.3 | 51.5 |
| 269 | Ag/0.1MgO—2.0Ag2O | e | 24.3 | 556.2 | 0.0 | 2.7 | 6.9 | 12.9 | 50.6 | 49.6 |
| 270 | Ag/0.1MgO—0.1Ag2O | e | 31.5 | 225.6 | 0.0 | 1.2 | 6.8 | 9.5 | 53.2 | 52.6 |
| 271 | Ag—1.0Ga/0.1MgO—0.03Ag2O | e | 38.0 | 413.6 | 0.0 | 2.2 | 7.2 | 12.4 | 51.7 | 51.5 |
| 272 | Ag—1.0Cu—0.8Ga/0.1MgO—0.03Ag2O | e | 26.7 | 376.0 | 0.0 | 2.0 | 7.4 | 11.9 | 51.5 | 50.5 |
| 273 | Ag—1.0Pd/0.1MgO—0.03Ag2O | e | 13.5 | 277.5 | 0.0 | 1.5 | 6.4 | 9.5 | 52.3 | 52.5 |
| 274 | Ag—1.0Cu—1.0Pd/0.1MgO—0.03PdO | e | 17.7 | 271.6 | 0.0 | 1.4 | 6.4 | 9.2 | 51.8 | 51.9 |
| 275 | Ag—1.0Ga/0.1Al2O3—0.03Ag2O | e | 18.5 | 296.8 | 0.0 | 1.4 | 7.0 | 10.1 | 52.9 | 51.9 |
| 276 | Ag—1.0Cu—0.8Ga/0.2Al2O3—0.03Ga2O3 | e | 16.5 | 329.8 | 0.0 | 1.7 | 6.4 | 10.1 | 51.2 | 50.0 |
| 277 | Ag—1.0Pd/0.1Al2O3—0.03Ag2O | e | 42.9 | 263.2 | 0.0 | 1.4 | 6.6 | 9.5 | 51.9 | 51.9 |
| 278 | Ag—1.0Cu—1.0Pd/0.1Al2O3—0.03Ag2O | e | 31.2 | 355.3 | 0.0 | 1.7 | 6.3 | 10.4 | 50.9 | 50.1 |

TABLE 10-continued

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 279 | Ag—1.0Ga/0.1In2O3—0.03Ag2O | e | 26.2 | 259.0 | 0.0 | 1.4 | 6.4 | 9.5 | 51.0 | 50.2 |
| 280 | Ag—1.0Cu—0.8Ga/0.1In2O3—0.03CuO | e | 23.5 | 515.0 | 0.0 | 2.5 | 6.2 | 11.3 | 52.9 | 52.6 |
|  | Ag100.0 |  | 23.8 | 1664.0 | 0.0 | 8.0 | 6.5 | 27.0 | 57.0 | 51.5 |

*1 A front part of "/" represents silver or a silver alloy of a matrix, and a rear part represents a compound phase.

*2 Methods for producing thin films are described below.

a: internally chemically-combined type target was used.

b: sintering type target was used.

c: embedded type target was used.

d: co-sputtering e: reactive sputtering

TABLE 11

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 281 | Ag—1.0Pd/0.1SnO2—0.03Ag2O | e | 12.3 | 466.4 | 0.0 | 2.2 | 6.5 | 11.9 | 51.3 | 50.3 |
| 282 | Ag—1.0Cu—1.0Pd/0.1SnO2—0.03Ag2O | e | 51.4 | 259.0 | 0.0 | 1.4 | 7.5 | 10.5 | 51.3 | 50.6 |
| 283 | Ag—1.0Ga/0.1ZnO—0.03Ga2O3 | e | 50.8 | 252.2 | 0.0 | 1.3 | 7.5 | 10.2 | 51.2 | 50.7 |
| 284 | Ag—1.0Cu—0.8Ga/0.1ZnO—0.03CuO | e | 18.9 | 222.0 | 0.0 | 1.2 | 6.6 | 9.2 | 51.3 | 51.5 |
| 285 | Ag/0.1TiO2—2.0PdO—0.03Ag2O | e | 11.8 | 636.0 | 0.0 | 3.0 | 7.3 | 14.0 | 49.3 | 48.8 |
| 286 | Ag—2.0Pd/0.1TiO2—0.03Ag2O | e | 40.6 | 351.5 | 0.0 | 1.9 | 7.8 | 11.8 | 49.5 | 48.7 |
| 287 | Ag—0.8Ga/0.1TiO2—0.03Ga2O3 | e | 33.7 | 343.8 | 0.0 | 1.8 | 6.7 | 11.1 | 51.2 | 50.1 |
| 288 | Ag—1.0Cu—0.8Ga/0.1TiO2—0.03CuO | e | 21.6 | 355.3 | 0.0 | 1.7 | 6.6 | 10.2 | 50.2 | 50.4 |
| 289 | Ag—1.0Pd/0.1TiO2—0.03PdO | e | 33.3 | 477.5 | 0.0 | 2.5 | 7.3 | 13.1 | 51.5 | 51.5 |
| 290 | Ag—1.0Cu—1.0Pd/0.1TiO2—0.03PdO | e | 25.9 | 401.1 | 0.0 | 2.1 | 6.5 | 10.8 | 50.4 | 48.8 |
| 291 | Ag—0.8Ga/0.1ZrO2—0.03Ga2O3 | e | 47.6 | 370.0 | 0.0 | 2.0 | 7.2 | 11.9 | 51.9 | 50.6 |
| 292 | Ag—1.0Cu—0.8Ga/0.1ZrO2—0.03Ga2O3 | e | 12.1 | 388.5 | 0.0 | 2.1 | 7.3 | 11.9 | 51.7 | 51.9 |
| 293 | Ag—1.0Pd/0.1ZrO2—0.03PdO | e | 36.6 | 466.9 | 0.0 | 2.3 | 7.1 | 12.5 | 50.4 | 49.6 |
| 294 | Ag—0.9Cu—1.0Pd/0.1ZrO2—0.1CuO | e | 23.5 | 459.8 | 0.0 | 2.2 | 6.9 | 12.1 | 49.9 | 48.6 |
| 295 | Ag—0.8Ga/0.1SiO2—0.03Ga2O3 | e | 47.1 | 376.0 | 0.0 | 2.0 | 6.9 | 11.4 | 49.4 | 49.5 |
| 296 | Ag—0.9Cu—0.8Ga/0.1SiO2—0.1CuO | e | 17.4 | 407.4 | 0.0 | 2.1 | 7.4 | 12.1 | 51.9 | 50.7 |
| 297 | Ag—0.9Pd/0.1SiO2—0.1PdO | e | 44.8 | 500.0 | 0.0 | 2.5 | 6.7 | 11.8 | 50.1 | 50.1 |
| 298 | Ag—1.0Cu—0.9Pd/0.1SiO2—0.1PdO | e | 38.4 | 365.4 | 0.0 | 1.8 | 6.6 | 10.3 | 50.8 | 49.9 |
| 299 | Ag—0.7Ga/0.1MnO—0.1Ga2O3 | e | 28.8 | 349.2 | 0.0 | 1.8 | 7.6 | 11.3 | 50.4 | 49.1 |
| 300 | Ag—1.0Cu—0.7Ga/0.1MnO—0.1Ga2O3 | e | 37.1 | 291.0 | 0.0 | 1.5 | 7.3 | 10.7 | 50.4 | 49.0 |
| 301 | Ag/0.1SiC—0.05PdO | e | 18.2 | 1293.1 | 0.0 | 7.2 | 7.0 | 24.4 | 55.2 | 53.7 |
| 302 | Ag—1.0Si/0.1Si3N4—0.05GaN | e | 14.5 | 1169.9 | 0.0 | 6.3 | 6.6 | 20.7 | 54.5 | 52.3 |
| 303 | Ag—1.0Ga/0.1SiC—0.1AgC—0.01Cu2Se | e | 44.7 | 785.4 | 0.0 | 4.4 | 7.1 | 15.8 | 54.2 | 53.0 |
| 304 | Ag—1.0Cu—0.8Ga/0.1Si3N4—0.01Cu2Te | e | 16.9 | 472.6 | 0.0 | 2.6 | 6.5 | 8.5 | 53.7 | 52.6 |
| 305 | Ag—1.0Pd/0.1SiO2—0.1Ag2O—0.01CuCl2 | e | 45.3 | 968.4 | 0.0 | 5.1 | 6.4 | 18.3 | 54.4 | 52.4 |
| 306 | Ag—1.0Cu—0.8Ga/0.1SiO2—0.01TiSi2 | e | 32.5 | 449.5 | 0.0 | 2.4 | 7.2 | 8.8 | 53.6 | 52.8 |
| 307 | Ag—1.0Pd/0.1SiN—0.01TiSi3 | e | 45.7 | 1060.0 | 0.0 | 5.6 | 7.4 | 20.7 | 54.3 | 53.7 |
| 308 | Ag—1.0Ga/0.1ZrC—0.01Ag2S | e | 33.9 | 890.5 | 0.0 | 4.5 | 6.4 | 15.3 | 54.5 | 63.3 |
| 309 | Ag—1.0Cu—0.8Ga/0.1ZrO2—0.01AgF | e | 24.2 | 420.9 | 0.0 | 2.3 | 6.5 | 7.8 | 53.9 | 53.3 |
| 310 | Ag—1.0Pd/0.1ZrN—0.01AgB | e | 42.5 | 1058.4 | 0.0 | 5.7 | 7.1 | 19.3 | 54.7 | 53.0 |
| 311 | Ag—1.0Cu—1.0Pd/0.1ZrO2—0.01PdSi | e | 36.2 | 609.7 | 0.0 | 3.1 | 7.2 | 10.2 | 53.6 | 52.5 |
| 312 | Ag—1.0Ga/0.1ZrO2—0.1Ag2O—0.01InF3 | e | 32.7 | 938.8 | 0.0 | 4.8 | 7.5 | 16.3 | 54.6 | 54.2 |
| 313 | Ag—1.0Cu—0.8Ga/0.1ZrC—0.05Cu3N | e | 34.8 | 449.5 | 0.0 | 2.6 | 7.4 | 8.8 | 53.7 | 53.7 |
| 314 | Ag—1.0Ga/0.1ZrSi2 | e | 46.6 | 826.0 | 0.0 | 4.3 | 7.1 | 14.6 | 54.4 | 54.1 |
| 315 | Ag—1.0Pd/0.1ZrSi2—0.01MnSi | e | 34.8 | 1018.9 | 0.0 | 5.1 | 6.3 | 17.3 | 54.4 | 52.2 |
| 316 | Ag—1.0Cu—0.8Ga/0.1ZrB2—0.01TiB2 | e | 25.7 | 517.3 | 0.0 | 2.7 | 7.3 | 9.7 | 54.2 | 54.0 |
| 317 | Ag—1.0Cu—1.0Pd/0.1TiSi2—0.01AgSi | e | 32.8 | 593.3 | 0.0 | 3.3 | 6.9 | 11.8 | 53.5 | 52.7 |
| 318 | Ag/1.0TiO2—0.01AgCl | e | 35.3 | 1347.4 | 0.0 | 7.6 | 6.8 | 26.3 | 54.5 | 52.6 |
| 319 | Ag—1.0Mn/0.1TiN—0.01AgP | e | 14.4 | 1135.8 | 0.0 | 6.3 | 7.0 | 20.7 | 54.5 | 52.1 |

TABLE 11-continued

| Sample No. | Sample composition wt. %[1] | Method for producing thin film[2] | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 320 | Ag—1.0Pd/0.1TiC—0.1AgC—0.01InCl3 | e | 22.8 | 1044.9 | 0.0 | 5.4 | 6.6 | 18.9 | 54.4 | 53.0 |
|  | Ag100.0 |  | 23.8 | 1664.0 | 0.0 | 8.0 | 6.5 | 27.0 | 57.0 | 51.5 |

[1] A front part of "/" represents silver or a silver alloy of a matrix, and a rear part represents a compound phase.

[2] Methods for producing thin films are described below.

a: internally chemically-combined type target was used.

b: sintering type target was used.

c: embedded type target was used.

d: co-sputtering e: reactive sputtering

TABLE 12

| Sample No. | Sample composition wt. %[1] | Method for producing thin film[2] | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 321 | Ag—1.0Cu—1.0Pd/0.1TiO2—0.05CuO | e | 46.8 | 665.3 | 0.0 | 3.8 | 6.8 | 13.6 | 53.6 | 52.8 |
| 322 | Ag—1.0Ga/0.1TiN—0.01TiB2 | e | 22.9 | 864.0 | 0.0 | 4.5 | 6.8 | 15.7 | 54.7 | 53.8 |
| 323 | Ag—1.0Cu—1.0Pd/0.1TiB2—0.01ZrB2 | e | 20.4 | 528.5 | 0.0 | 3.1 | 6.2 | 10.2 | 54.1 | 53.6 |
| 324 | Ag—1.0Ga/0.1TiB2—0.01ZrB2 | e | 39.6 | 932.9 | 0.0 | 4.9 | 7.5 | 18.1 | 54.3 | 53.5 |
| 325 | Ag—1.0Cu—0.8Ga/0.1TiSi2—0.01ZrSi2 | e | 45.2 | 436.3 | 0.0 | 2.4 | 6.2 | 7.9 | 54.3 | 54.3 |
| 326 | Ag—1.0Ga/0.1Mn3C—0.01Ag2Se | e | 39.7 | 907.1 | 0.0 | 4.7 | 6.3 | 15.5 | 54.4 | 53.8 |
| 327 | Ag—1.0Cu—0.8Ga/0.1MnN—0.01Ag2Te | e | 24.2 | 501.2 | 0.0 | 2.6 | 7.3 | 8.8 | 54.1 | 53.0 |
| 328 | Ag—1.0Ga/0.1MnN—0.1AgN—0.01InP | e | 21.2 | 848.2 | 0.0 | 4.5 | 7.1 | 16.6 | 54.6 | 54.0 |
| 329 | Ag—1.0Cu—0.8Ga/0.1MnC—0.01SnS | e | 24.7 | 477.0 | 0.0 | 2.7 | 6.5 | 9.1 | 54.1 | 53.3 |
| 330 | Ag/0.1MnO—2.0Ag2O—0.01SnSe | e | 16.3 | 1336.8 | 0.0 | 7.3 | 7.3 | 26.0 | 53.6 | 53.2 |
| 331 | Ag—2.0Pd/0.1Mn2P—0.01Zn2P | e | 20.9 | 1138.5 | 0.0 | 5.8 | 7.0 | 21.4 | 53.4 | 53.3 |
| 332 | Ag—1.0Pd/0.1Al4C3—0.01GaP | e | 22.3 | 1000.1 | 0.0 | 5.1 | 6.4 | 18.8 | 54.3 | 54.1 |
| 333 | Ag—1.0Cu—1.0Pd/0.1Al2O3—0.01GaS | e | 16.9 | 638.6 | 0.0 | 3.6 | 7.4 | 12.9 | 53.8 | 52.8 |
| 334 | Ag/0.1AlN—0.01GaSe | e | 33.9 | 1516.1 | 0.0 | 7.7 | 7.2 | 25.9 | 55.2 | 52.4 |
| 335 | Ag/0.1AlN—0.1Ag2N—0.01SnTe | e | 33.1 | 1380.8 | 0.0 | 7.4 | 6.7 | 25.3 | 55.2 | 52.4 |
| 336 | Ag—1.0Ga/0.1Al4C3—0.1AgC—0.01ZnS | e | 26.6 | 799.2 | 0.0 | 4.5 | 7.1 | 15.7 | 54.6 | 54.3 |
| 337 | Ag—1.0Cu—0.8Ga/0.1Al2O3—0.01ZnF2 | e | 17.4 | 477.1 | 0.0 | 2.8 | 6.3 | 10.0 | 54.2 | 53.0 |
| 338 | Ag—1.0Pd/0.1AlB2—0.01MgB2 | e | 20.7 | 960.8 | 0.0 | 5.1 | 6.8 | 17.3 | 54.3 | 52.9 |
| 339 | Ag—1.0Cu—1.0Pd/0.1Al2S3—0.01MgS | e | 39.9 | 589.9 | 0.0 | 3.4 | 6.5 | 12.2 | 53.8 | 53.9 |
| 340 | Ag—1.0Pd/0.1AlF3 | e | 42.6 | 1100.9 | 0.0 | 5.6 | 7.5 | 19.6 | 54.6 | 52.1 |
| 341 | Ag/0.1MgO—0.1Ag2O—0.01GaTe | e | 28.9 | 1326.2 | 0.0 | 7.2 | 6.9 | 25.9 | 55.1 | 54.1 |
| 342 | Ag—10Ga/0.1Mg3N2—0.01Ga2Te3 | e | 38.8 | 806.9 | 0.0 | 4.4 | 6.5 | 15.4 | 54.5 | 52.4 |
| 343 | Ag—1.0Pd/0.1Mg3N2—0.1AgN—0.01ZnSe | e | 21.7 | 1121.1 | 0.0 | 5.7 | 6.4 | 19.9 | 54.2 | 52.4 |
| 344 | Ag—1.0Ga/0.1MgB2—0.01MnB | e | 15.9 | 729.8 | 0.0 | 4.1 | 6.5 | 14.7 | 54.6 | 53.5 |
| 345 | Ag—1.0Cu—0.8Ga/0.1MgSi—0.01MnSi | e | 42.7 | 482.1 | 0.0 | 2.8 | 6.5 | 9.5 | 54.4 | 53.5 |
| 346 | Ag—1.0Pd/0.1MgCl2—0.01MnCl2 | e | 22.0 | 1060.0 | 0.0 | 5.6 | 6.5 | 20.1 | 54.4 | 53.7 |
| 347 | Ag—1.0Cu—0.8Ga/0.1MgF2—0.01MnF2 | e | 31.2 | 430.3 | 0.0 | 2.3 | 6.9 | 8.0 | 54.0 | 53.5 |
| 348 | Ag—1.0Cu—1.0Pd/0.1MgCl2—0.01MnCl2 | e | 43.1 | 669.8 | 0.0 | 3.4 | 6.9 | 12.2 | 53.5 | 52.7 |
| 349 | Ag—1.0Cu—1.0Pd/0.1MgS—0.01ZrS2 | e | 45.4 | 734.1 | 0.0 | 3.8 | 7.3 | 12.5 | 54.0 | 53.5 |
| 350 | Ag—1.0Cu—0.8Ga/0.1ZnO—0.01Cu2S | e | 39.8 | 433.6 | 0.0 | 2.2 | 6.8 | 8.1 | 53.6 | 53.4 |
| 351 | Ag—1.0Cu—1.0Pd/0.1ZnO—0.01ZnTe | e | 26.4 | 707.8 | 0.0 | 3.7 | 7.4 | 12.9 | 54.3 | 53.1 |
| 352 | Ag—1.0Cu—1.0Pd/0.1ZnF2—0.01MnF2 | e | 31.3 | 726.1 | 0.0 | 3.9 | 6.4 | 14.0 | 53.9 | 52.9 |
| 353 | Ag—1.0Pd/0.1ZnS—0.01ZrS2 | e | 24.4 | 992.9 | 0.0 | 5.1 | 7.1 | 17.8 | 54.5 | 53.4 |
| 354 | Ag—1.0Pd/0.1SnO2—0.1Ag2O—0.01Cu3P | e | 43.9 | 979.8 | 0.0 | 5.7 | 6.3 | 21.0 | 54.3 | 54.1 |
| 355 | Ag—1.0Ga/0.1SnO2—0.1Ag2O—0.01MgS | e | 18.3 | 827.5 | 0.0 | 4.6 | 6.2 | 16.1 | 54.5 | 52.8 |
| 356 | Ag—1.0Cu—0.8Ga/0.1SnS—0.01Al2S3 | e | 18.8 | 442.7 | 0.0 | 2.3 | 6.6 | 7.8 | 54.2 | 53.7 |
| 357 | Ag—1.0Cu—1.0Pd/0.1In2O3—0.01Cu5Si | e | 46.3 | 567.9 | 0.0 | 3.3 | 6.5 | 11.2 | 54.0 | 53.1 |
| 358 | Ag—1.0Cu—0.8Ga/0.1In2O3—0.01MgF2 | e | 18.6 | 413.5 | 0.0 | 2.4 | 6.4 | 8.4 | 54.3 | 54.3 |
| 359 | Ag—1.0Ga/0.1In2O3—0.01MgCl2 | e | 39.6 | 854.9 | 0.0 | 4.7 | 6.3 | 16.4 | 54.6 | 52.6 |

TABLE 12-continued

| Sample No. | Sample composition wt. %*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 360 | Ag—1.0Ga/0.1InP—0.01Mn2P | e | 29.7 | 863.5 | 0.0 | 4.5 | 6.2 | 14.8 | 54.7 | 54.7 |
|  | Ag100.0 |  | 23.8 | 1664.0 | 0.0 | 8.0 | 6.5 | 27.0 | 57.0 | 51.5 |

*1A front part of "/" represents silver or a silver alloy of a matrix, and a rear part represents a compound phase.
*2Methods for producing thin films are described below.
a: internally chemically-combined type target was used.
b: sintering type target was used.
c: embedded type target was used.
d: co-sputtering
e: reactive sputtering As is clear from those Tables, it was confirmed that a recording medium provided with a reflection film having a compound phase dispersed therein according to the present invention showed less occurrences of a PI error and a PO failure and further a lower decreasing rate of a reflectance than a DVD medium provided with a reflection film formed from pure silver. For information, the DVD medium provided with the reflection film formed from pure silver was not recognized by a recording device after a humidification test, and became unusable.

INDUSTRIALLY APPLICABLE FIELD

As described above, a thin film according to the present invention minimizes the deterioration of the reflectance even after a long period of use, and can prolong the life of various devices which use the thin film as a reflection film, such as an optical recording medium and a display. The reflection film according to the present invention has also reflectance-keeping characteristics which are little affected by a wavelength of incident light. In this regard, the wavelength of light for a light source for recording is being shortened such as in the development of an HD-DVD using a blue laser beam, in a field of an optical recording medium. The present invention can cope with such a technology. The thin film according to the present invention provides merits of reducing the number of errors and extending the life, when applied to the optical recording medium, for instance.

In the present invention, a reflection film has only to have a function of reflecting light, and includes a film having optical transparency. Accordingly, the thin film according to the present invention can be also applied to a semi-reflection/semi-transparent film used in an optical recording medium.

The invention claimed is:

1. A thin film for a reflection film or for a semi-transparent reflection film, comprising a compound phase formed of at least one selected from the group consisting of a nitride, an oxide, a composite oxide, a nitroxide, a carbide, a sulfide, a chloride, a silicide excluding silicon, a fluoride, a boride, a hydride, a phosphide, a selenide and a telluride of aluminum, magnesium, tin, zinc, indium, titanium, zirconium, manganese and silicon, dispersed in a matrix formed of a silver alloy wherein the silver alloy includes at least any one alloying element selected from the group consisting of aluminum, magnesium, tin, zinc, indium, titanium, zirconium, manganese and silicon.

2. The thin film for a reflection film or for a semi-transparent reflection film according to claim 1, wherein at least one selected from the group consisting of nitride, an oxide, a composite oxide, a nitroxide, carbide, sulfide, chloride, silicide, fluoride, boride, hydride, phosphide, selenide and telluride of silver is dispersed as a compound phase.

3. The thin film for a reflection film or for a semi-transparent reflection film according to claim 1, wherein at least one selected from the group consisting of a nitride, an oxide, a composite oxide, a nitroxide, a carbide, a sulfide, a chloride, a silicide, a fluoride, a boride, a hydride, a phosphide, a selenide and a telluride of gallium, palladium or copper is further dispersed as a compound phase.

4. The thin film according to claim 1, wherein the compound phases have a content of 0.001 to 2.5 wt. %.

5. The thin film according to claim 1, wherein the compound phases have a content of 0.001 to 1.0 wt. %.

6. The thin film according to claim 1, wherein the compound phases have a content of 0.001 to 0.5 wt. %.

7. The thin film for a reflection film or for a semi-transparent reflection film according to claim 1, wherein the silver alloy further includes at least any one alloying element selected from the group consisting of gallium, palladium and copper.

8. The thin film for a reflection film or for a semi-transparent reflection film according to claim 1, wherein the alloying element has a concentration of 0.01 to 10 wt. %.

9. The thin film for a reflection film or for a semi-transparent reflection film according to claim 1, wherein the alloying element has a concentration of 0.01 to 5 wt. %.

10. The thin film for a reflection film or for a semi-transparent reflection film according to claim 1, wherein the alloying element has a concentration of 0.01 to 3.5 wt. %.

11. A sputtering target for a reflection film or for a semi-transparent reflection film, comprising a compound phase formed of at least one selected from the group consisting of a nitride, an oxide, a composite oxide, a nitroxide, a carbide, a sulfide, a chloride, a silicide excluding silicon, a fluoride, a boride, a hydride, a phosphide, a selenide and a telluride of aluminum, magnesium, tin, zinc, indium, titanium, zirconium, manganese and silicon, dispersed in a matrix formed of a silver alloy wherein the silver alloy includes at least any alloying element selected from the group consisting of aluminum, magnesium, tin, zinc, indium, titanium, zirconium, manganese and silicon.

12. A sputtering target for a reflection film or for a semi-transparent reflection film according to claim 11, wherein at least one selected from the group consisting of nitride, an oxide, a composite oxide, a nitroxide, carbide, sulfide, chloride, silicide, fluoride, boride, hydride, phosphide, selenide and telluride of silver is dispersed as a compound phase.

13. A sputtering target for a reflection film or for a semi-transparent reflection film according to claim 11, wherein at least one selected from the group consisting of a nitride, an oxide, a composite oxide, a nitroxide, a carbide, a sulfide, a chloride, a silicide, a fluoride, a boride, a hydride, a phosphide, a selenide and a telluride of gallium, palladium or copper is further dispersed as a compound phase.

14. The sputtering target according to claim 11, wherein the compound phases have a content of 0.001 to 2.5 wt. %.

15. The sputtering target according to a claim 11, wherein the compound phases have a content of 0.001 to 1.0 wt. %.

16. The sputtering target according to claim 11, wherein the compound phases have a content of 0.001 to 0.5 wt. %.

17. The sputtering target for a reflection film or for a semi-transparent reflection film according to claim 11, wherein the silver alloy further includes at least any alloying element selected from the group consisting of gallium, palladium and copper.

18. The sputtering target for a reflection film or for a semi-transparent reflection film according to claim 11, wherein the alloying element has a concentration of 0.01 to 10 wt. %.

19. The sputtering target for a reflection film or for a semi-transparent reflection film according to claim 11, wherein the alloying element has a concentration of 0.01 to 5 wt. %.

20. The sputtering target for a reflection film or for a semi-transparent reflection film according to claim 11, wherein the alloying element has a concentration of 0.01 to 3.5 wt. %.

21. An optical recording medium comprising the thin film defined in claim 1, as a reflection film or a semi-transparent reflection film.

* * * * *